US010680014B2

(12) United States Patent
Ryu et al.

(10) Patent No.: US 10,680,014 B2
(45) Date of Patent: Jun. 9, 2020

(54) INTEGRATED CIRCUIT INCLUDING ASYMMETRIC ENDING CELLS AND SYSTEM-ON-CHIP INCLUDING THE SAME

(71) Applicant: Samsung Electronics Co., Ltd., Suwon-si, Gyeonggi-do (KR)

(72) Inventors: Jong-kyu Ryu, Seoul (KR); Min-su Kim, Hwaseong-si (KR); Dae-seong Lee, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/963,629

(22) Filed: Apr. 26, 2018

(65) Prior Publication Data

US 2019/0074296 A1   Mar. 7, 2019

(30) Foreign Application Priority Data

Sep. 7, 2017   (KR) ........................ 10-2017-0114698

(51) Int. Cl.
| | | |
|---|---|---|
| *G06F 17/50* | (2006.01) | |
| *H01L 27/118* | (2006.01) | |
| *H01L 27/02* | (2006.01) | |
| *H01L 29/94* | (2006.01) | |

(52) U.S. Cl.
CPC .... *H01L 27/11807* (2013.01); *H01L 27/0207* (2013.01); *H01L 29/94* (2013.01); *H01L 2027/1187* (2013.01); *H01L 2027/1189* (2013.01); *H01L 2027/11842* (2013.01); *H01L 2027/11861* (2013.01); *H01L 2027/11875* (2013.01); *H01L 2027/11881* (2013.01)

(58) Field of Classification Search
None
See application file for complete search history.

(56) References Cited

U.S. PATENT DOCUMENTS

| | | |
|---|---|---|
| 6,550,049 B1 | 4/2003 | Torii |
| 7,137,092 B2 | 11/2006 | Maeda |
| 7,538,368 B2 | 5/2009 | Yano |

(Continued)

FOREIGN PATENT DOCUMENTS

| | | |
|---|---|---|
| JP | H0945781 A | 2/1997 |
| JP | 4491113 B1 | 3/2001 |
| JP | 2002-009262 A | 1/2002 |

OTHER PUBLICATIONS

Singaporean Office Action dated Feb. 20, 2019 issued in corresponding Singaporean Application No. 10201804912V.

(Continued)

*Primary Examiner* — Ali Naraghi
(74) *Attorney, Agent, or Firm* — Harness, Dickey & Pierce, P.L.C.

(57) ABSTRACT

An integrated circuit including first and second macroblocks arranged in a first direction, and a plurality of cells between the first macroblock and the second macroblock, the plurality of cells including at least one first ending cell adjacent to the first macroblock and having a first width in the first direction, at least one second ending cell adjacent to the second macroblock and having a second width different from the first width in the first direction, and at least one standard cell between the at least one first ending cell and the at least one second ending cell may be provided.

16 Claims, 26 Drawing Sheets

(56) References Cited

U.S. PATENT DOCUMENTS

| | | |
|---|---|---|
| 7,546,568 B2 | 6/2009 | Dirks et al. |
| 7,685,540 B1 * | 3/2010 | Madden ................ G06F 30/394 |
| | | 716/135 |
| 7,737,472 B2 | 6/2010 | Kondo et al. |
| 7,800,140 B2 | 9/2010 | Nakanishi et al. |
| 8,966,428 B2 * | 2/2015 | Lin ...................... G06F 30/392 |
| | | 716/124 |
| 9,059,036 B2 | 6/2015 | Abe |
| 9,419,014 B2 | 8/2016 | Gurumurthy |
| 2007/0200182 A1 * | 8/2007 | Liaw .................... G11C 11/412 |
| | | 257/393 |
| 2009/0113370 A1 | 4/2009 | Yoshinaga |
| 2009/0206451 A1 * | 8/2009 | Uno .................... H01L 27/0207 |
| | | 257/618 |
| 2010/0299848 A1 | 11/2010 | Dellinger |
| 2014/0225201 A1 * | 8/2014 | Paul .................... H01L 27/1104 |
| | | 257/401 |
| 2014/0353727 A1 * | 12/2014 | Etherton ........... H01L 21/76895 |
| | | 257/203 |
| 2017/0053917 A1 * | 2/2017 | Azmat ................ H01L 27/0924 |

OTHER PUBLICATIONS

Indian Office Action dated Mar. 10, 2020 issued in corresponding Indian Patent Application No. 201844018604.

\* cited by examiner

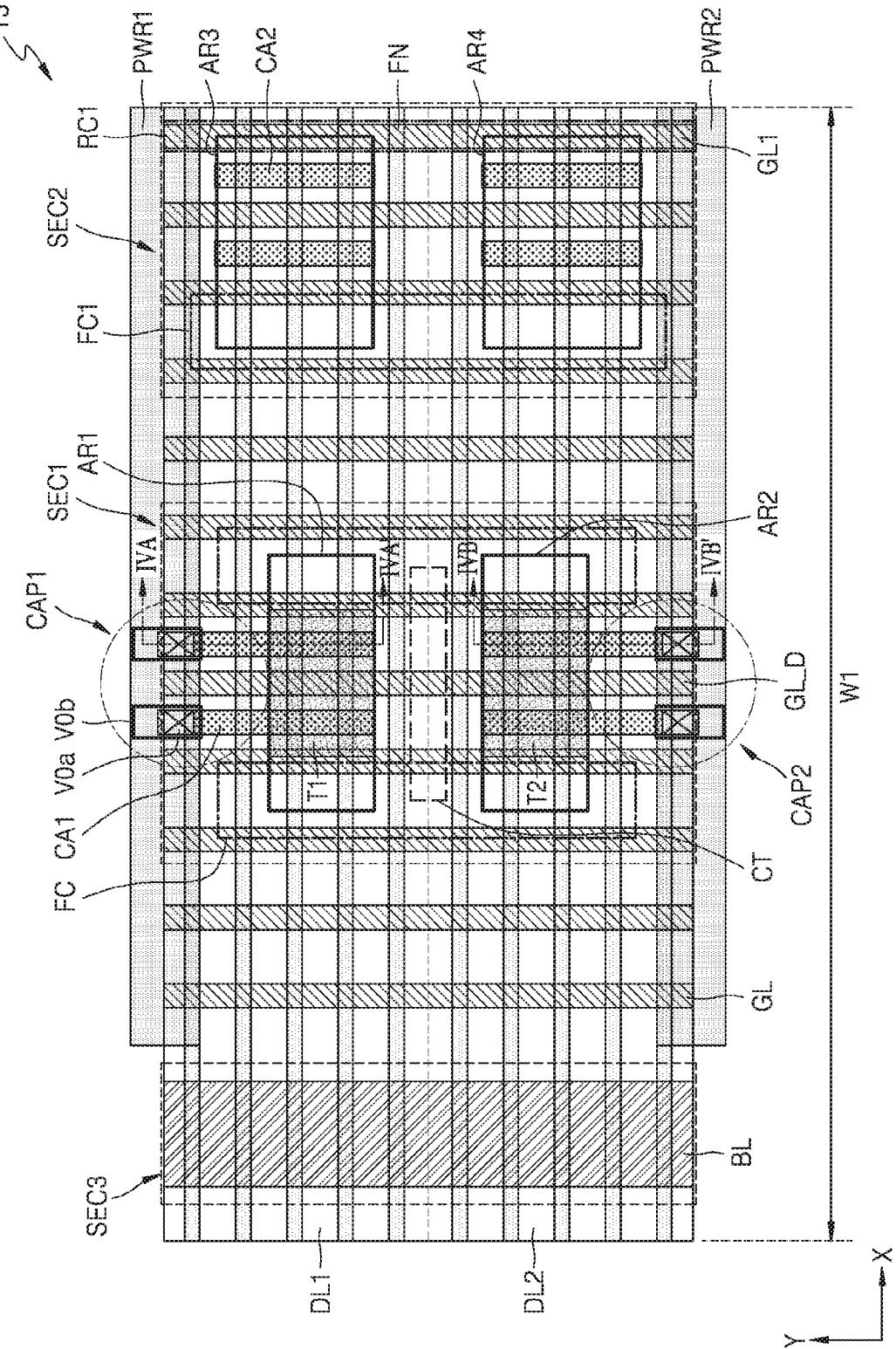

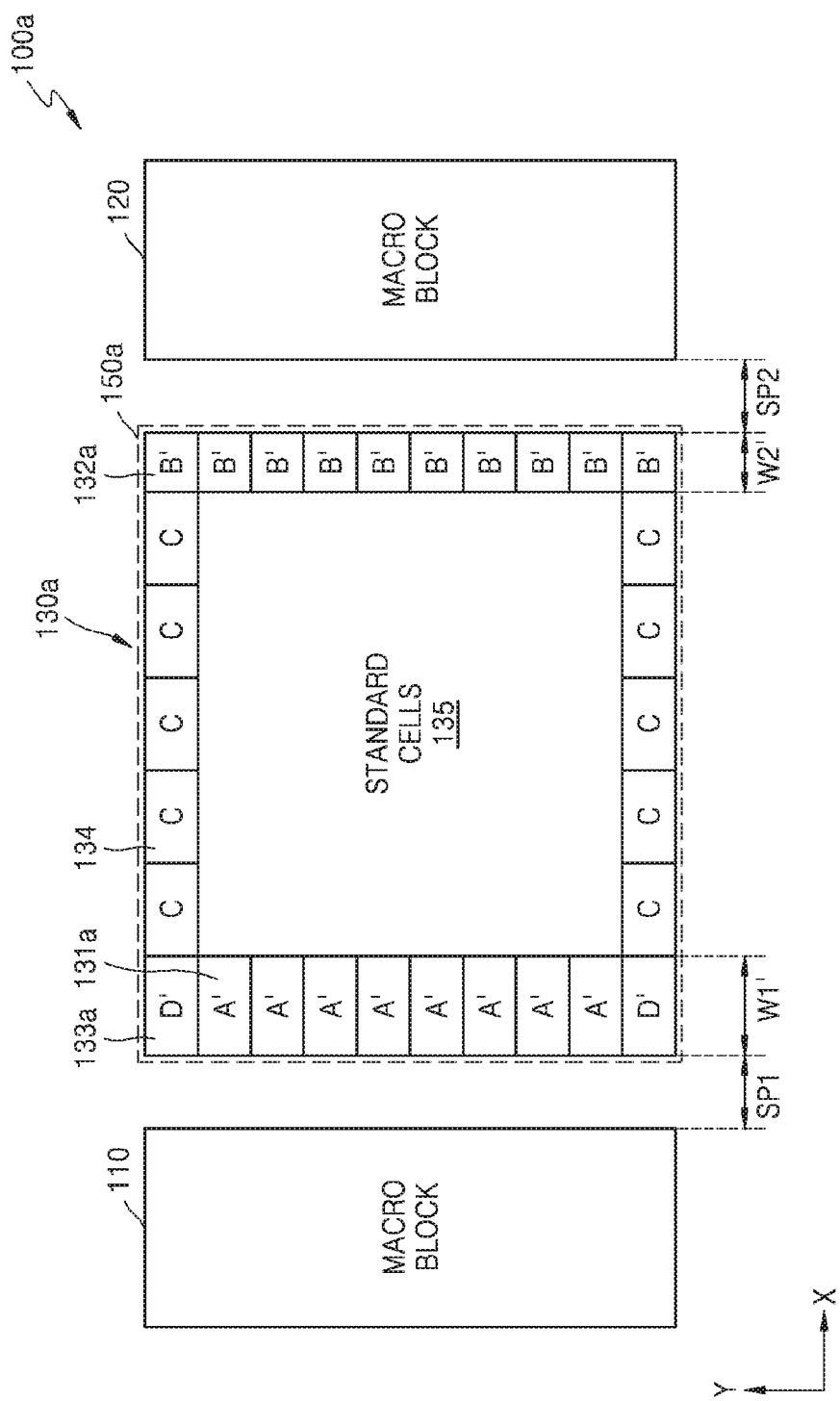

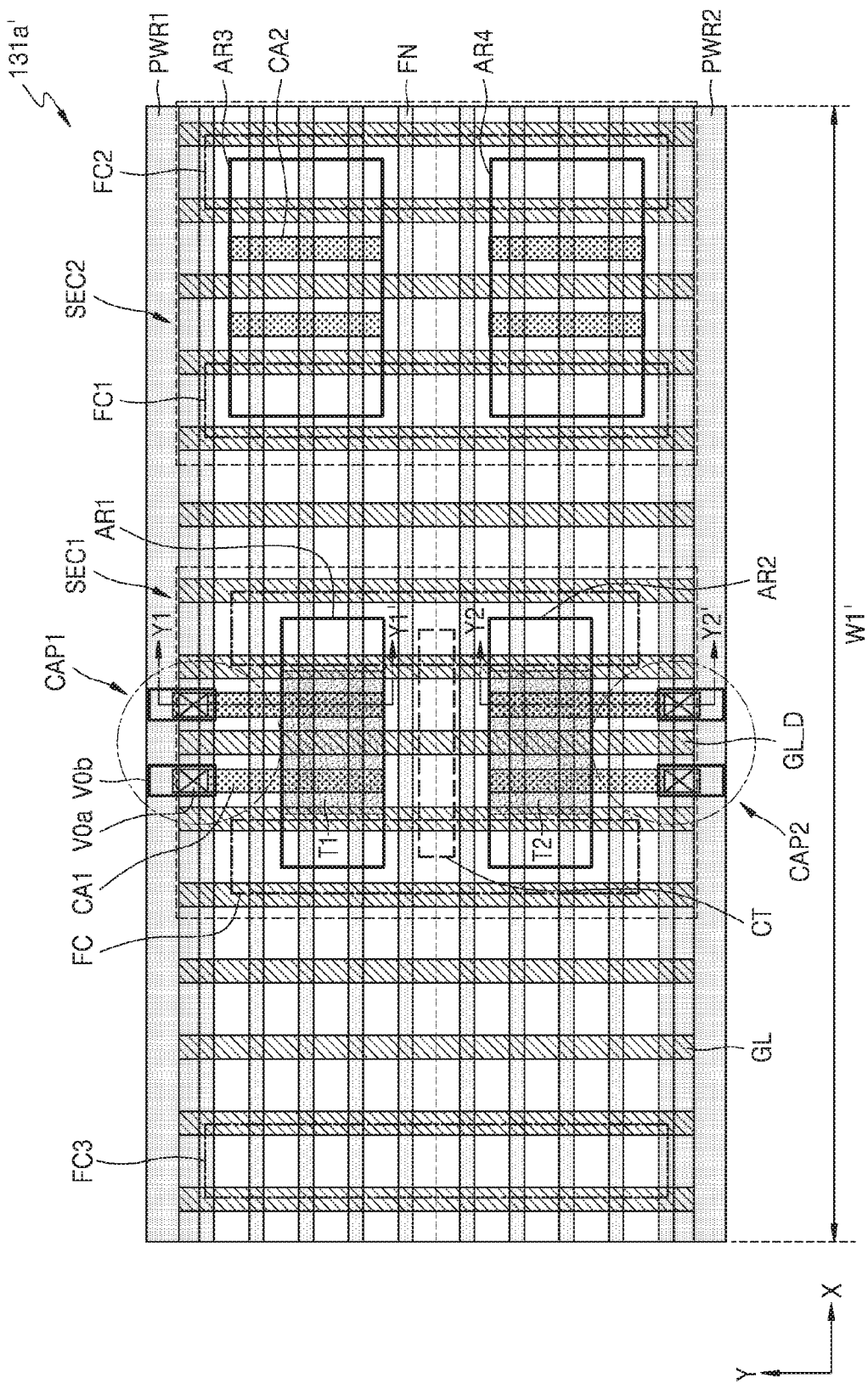

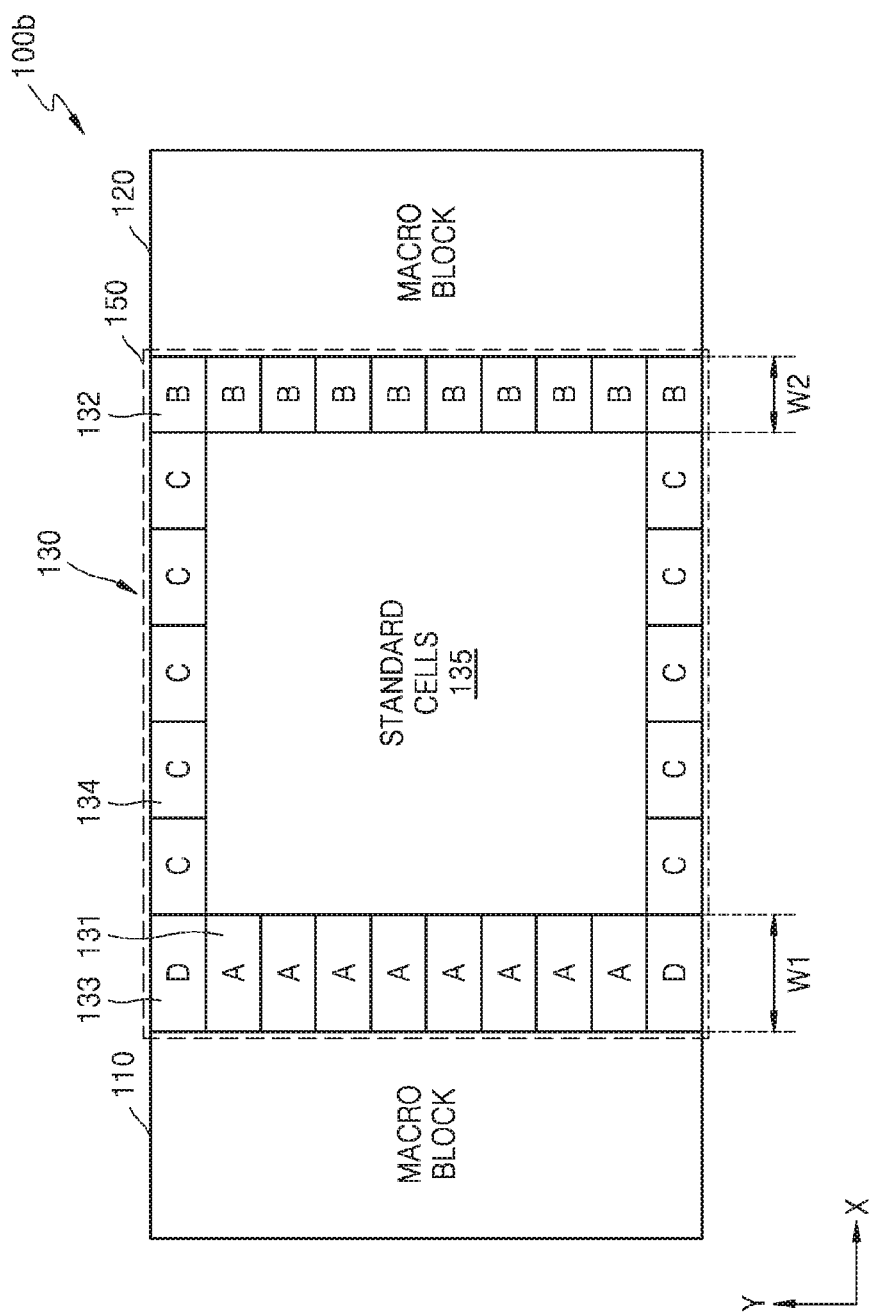

INTEGRATED CIRCUIT INCLUDING ASYMMETRIC ENDING CELLS AND SYSTEM-ON-CHIP INCLUDING THE SAME

CROSS-REFERENCE TO RELATED APPLICATION

This application claims priority under 35 U.S.C. § 119 to Korean Patent Application No. 10-2017-0114698, filed on Sep. 7, 2017, in the Korean Intellectual Property Office, the disclosure of which is incorporated herein in its entirety by reference.

BACKGROUND

The inventive concepts of the present disclosure relate to integrated circuits, and more particularly, to integrated circuits including asymmetric ending cells and/or a system-on-chips including the integrated circuit.

A system-on-chip is an integrated circuit that integrates all components of a computer or electronic system on a single chip. The integrated circuit includes macroblocks and a logic area, and may be designed based on standard cells. For example, the standard cells may be placed in the logic area, and the standard cells may also be placed in an area between adjacent macroblocks. As patterns of semiconductor elements are miniaturized, areas for the standard cells decrease, thereby reducing an implementation area of the integrated circuit. Thus, various methods are desired to reduce the implementation area of the integrated circuit.

SUMMARY

According to an example embodiment of the inventive concepts, an integrated circuit may include first and second macroblocks arranged in a first direction, and a plurality of cells between the first macroblock and the second macroblock. The plurality of cells may include at least one first ending cell adjacent to the first macroblock and having a first width in the first direction, at least one second ending cell adjacent to the second macroblock and having a second width different from the first width in the first direction, and at least one standard cell between the at least one first ending cell and the at least one second ending cell.

According to an example embodiment of the inventive concepts, an integrated circuit may include first and second macroblocks arranged in a first direction, and a plurality of cells between the first macroblock and the second macroblock. The plurality of cells may include first ending cells adjacent to the first macroblock and arranged in a line in a second direction perpendicular to the first direction, each of the first ending cells having a first width in the first direction, second ending cells adjacent to the second macroblock and arranged in a line in the second direction, each of the second ending cells having the first width in the first direction, and center cells arranged in a line in the second direction in an area between the first ending cells and the second ending cells.

According to an example embodiment of the inventive concepts, a system-on-chip may include an application processor, which includes first and second macroblocks arranged in a first direction, and a plurality of cells between the first and second macroblocks, the plurality of cells having first ending cells adjacent to the first macroblock and arranged in a line in a second direction perpendicular to the first direction, and second ending cells arranged in a line in the second direction and being implemented asymmetrically to the first ending cells, and a memory electrically connected to the application processor.

BRIEF DESCRIPTION OF THE DRAWINGS

Example embodiments of the inventive concepts will be more clearly understood from the following detailed description taken in conjunction with the accompanying drawings in which:

FIGS. 3A and 3B are layouts illustrating examples of a first ending cell in FIG. 2;

FIG. 6 illustrates an example of an integrated circuit according to an example embodiment of the inventive concepts;

FIGS. 7A and 7B are layouts illustrating examples of a first ending cell in FIG. 6;

FIGS. 9A and 9B illustrate examples of an integrated circuit according to some example embodiments of the inventive concepts;

DETAILED DESCRIPTION

Hereinafter, embodiments of the inventive concepts will be described in detail with reference to the accompanying drawings.

Figure 1:
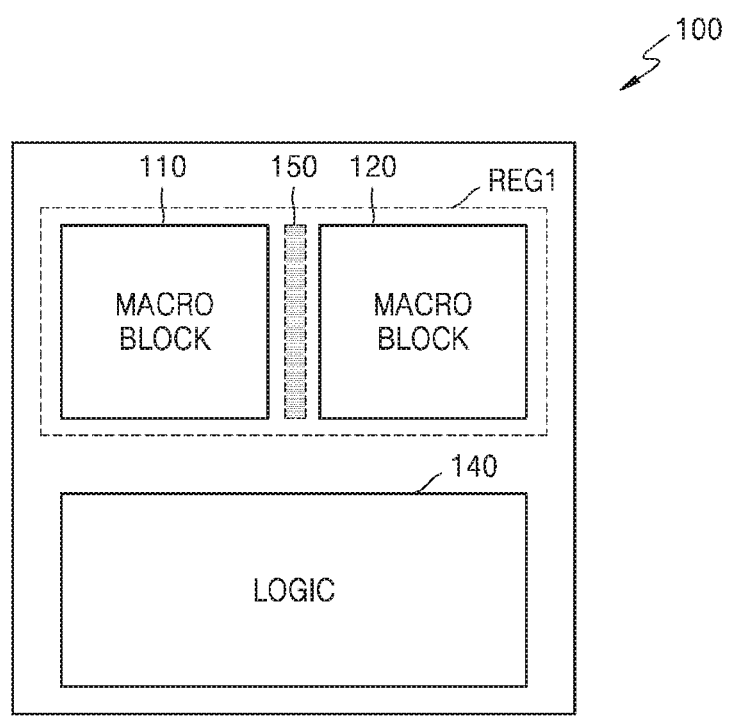
FIG. 1 is a block diagram of an integrated circuit according to an example embodiment of the inventive concepts.

FIG. 1 is a block diagram of an integrated circuit 100 according to an example embodiment of the inventive concepts.

Referring to FIG. 1, the integrated circuit 100 may include first and second macroblocks 110 and 120 and a logic area 140. The first and second macroblocks 110 and 120 may be various hard macro intellectual properties (IPs). Each of the hard macro IPs may refer to a reusable block implemented to have a fixed layout and interconnection specified to perform a desired electrical function. According to some example embodiments, a hard macro IP may be referred to as a hard macro or a macro cell. In an example embodiment, at least one of the first and second macroblocks 110 and 120 may be a memory block (e.g., Static Random Access Memory (SRAM)).

A plurality of standard cells may be arranged in the logic area 140, and the logic area 140 may be implemented using a standard cell library. According to some example embodiments, the logic area 140 may be referred to as a logic circuit area or a digital logic circuit area. The standard cell library may include information about a plurality of standard cells and may be stored in a computer-readable storage medium.

The standard cell may refer to a unit of an integrated circuit in which the size of a layout satisfies a desired (or alternatively, predetermined) rule. The height of the standard cell may be constant and the width of the standard cell may differ depending on standard cells. The standard cell may include a single height cell that is placed over one row, and a multi-height cell corresponding to a plurality of rows. The standard cell may include an input pin and an output pin, may process an input signal received at the input pin, and may output an output signal through the output pin. For example, the standard cell may include basic cells such as AND, OR, NOR, and an inverter, complex cells such as OR/AND/INVERTER (OAI) and AND/OR/INVERTER (AOI), and storage elements such as a master-slave flip-flop and a latch.

A plurality of cells may be arranged in a first area 150 between the first and second macroblocks 110 and 120, and the plurality of cells may include standard cells and ending cells. The ending cells may refer to cells that are arranged around the standard cells to reduce a proximity effect from neighbouring cells. For example, the ending cells may be arranged at the edge of an N-type well. Also, the ending cells may include a decoupling capacitor, thereby reducing voltage noise in the integrated circuit 100. Furthermore, the ending cells may include ties or taps (e.g., well ties or well taps, or substrate ties or substrate taps), and thus may mitigate or prevent a latch-up that may occur when a forward bias is applied to a diode at a substrate/well junction. The ending cells will be described in more detail with reference to FIG. 3A.

Because the logic area 140 occupies a considerably large area in the integrated circuit 100, the ending cells may be arranged symmetrically around the standard cells in order to perform the above-described function of the ending cells, and constraints on the placement of the standard cell and ending cells may not be severe. In some example embodiments, the first area 150 between the first and second macroblocks 110 and 120 may be considerably narrow in the integrated circuit 100. Thus, the ending cells may not be arranged symmetrically around the standard cells in order to perform the above-described function of the ending cells. Because the first area 150 is narrow, when the same or symmetric ending cells are symmetrically arranged in a left edge region and a right edge region of the first area 150, decoupling capacitors, ties, or taps of the ending cell may overlap each other.

According to the present example embodiment, asymmetric ending cells may be arranged in the first area 150. For example, some of the ending cells arranged in the first area 150 may have a configuration in which redundant devices or features are omitted. Accordingly, the width of the first area 150 may be reduced than conventional arts, and as a result, an implementation area of the integrated circuit 100 may be reduced than conventional arts. Hereinafter, various example embodiments of a dashed line region REG1 including the first and second macroblocks 110 and 120 and the first area 150 will be described with reference to FIGS. 2 to 13.

Figure 2:
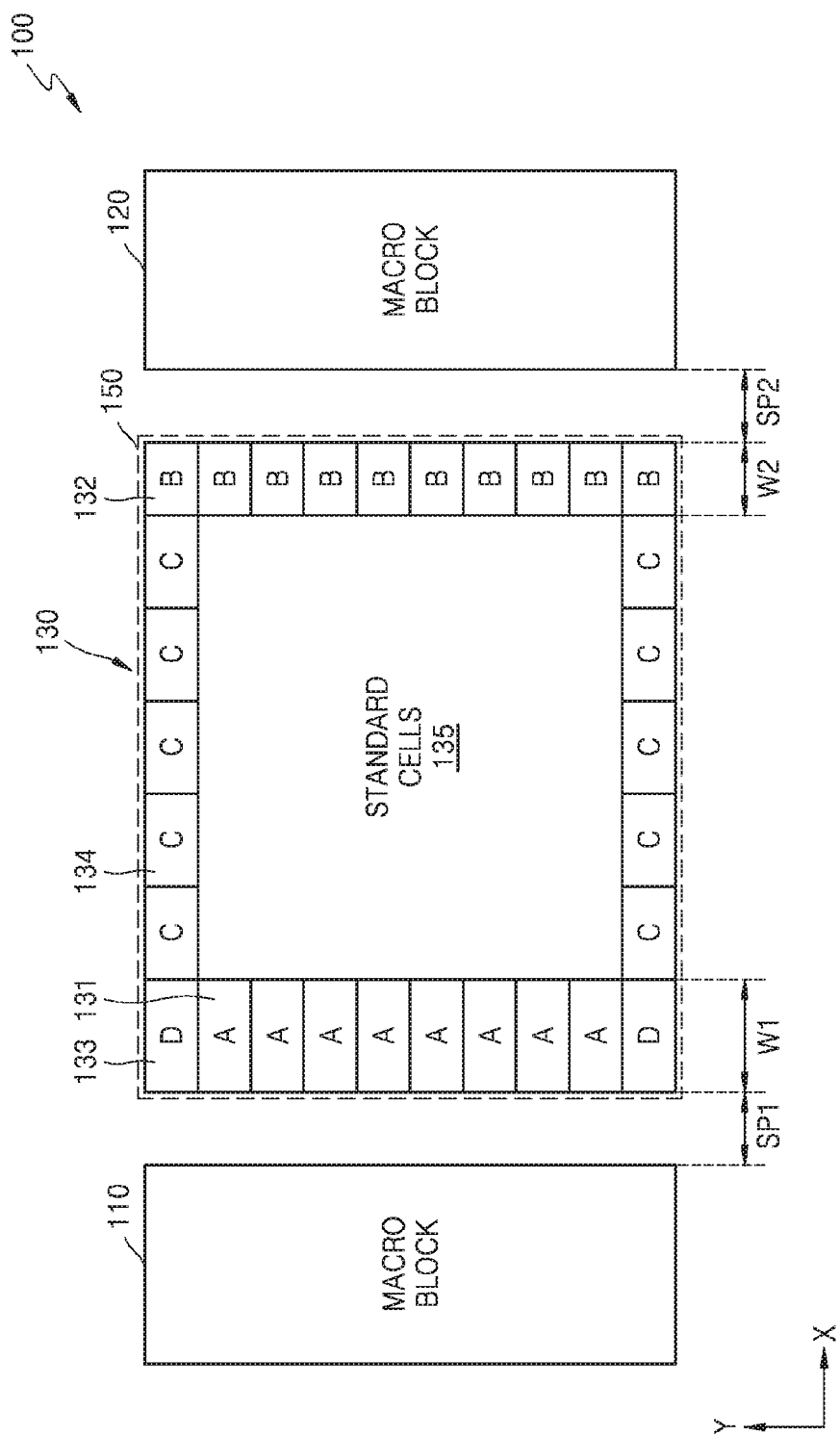
FIG. 2 illustrates an example of an integrated circuit according to an example embodiment of the inventive concepts.

FIG. 2 illustrates an example 100 of an integrated circuit according to an example embodiment of the inventive concepts.

Referring to FIG. 2, first and second macroblocks 110 and 120 may be arranged in a first direction (e.g., the X direction). In an example embodiment, the heights of the first and second macroblocks 110 and 120 in a second direction (e.g., the Y direction) may be equal to each other. In this case, the second direction may be a direction perpendicular to the first direction. However, the inventive concepts are not limited thereto. In some example embodiments, the heights of the first and second macroblocks 110 and 120 in the second direction (e.g., the Y direction) may be different from each other.

A plurality of cells 130 may be arranged in the first area 150 between the first and second macroblocks 110 and 120. In FIG. 2, the width of the first area 150 in the first direction is shown to be greater than the widths of the first and second macroblocks 110 and 120 for convenience. However, in practice, the width of the first area 150 may be much narrower than the widths of the first and second macroblocks 110 and 120. The plurality of cells 130 may include first to fourth ending cells 131 to 134 arranged in edge regions of the first area 150 and a plurality of standard cells 135 arranged in a central region of the first area 150. In FIG. 2, the first ending cells 131 are represented by 'A', the second ending cells 132 are represented by 'B', the third ending cells 133 are represented by 'D', and the fourth ending cells 134 are represented by 'C'. The first to fourth ending cells 131 to 134 may be referred to as beginning cells or dummy cells.

The first ending cells 131 and the second ending cells 132 may be implemented with asymmetric ending cells. The first ending cells 131 represented by 'A' may be arranged adjacent to the first macroblock 110 and may be arranged in a line in the second direction. Each of the first ending cells 131 may have a first width W1 in the first direction. The second ending cells 132 represented by 'B' may be arranged adjacent to the second macroblock 120 and may be arranged in a line in the second direction. Each of the second ending cells 132 may have a second width W2 in the first direction. The first width W1 may be different from the second width W2.

In an example embodiment, each of the second ending cells 132 may be implemented such that some devices or features in the first ending cell 131 are omitted. Accordingly, the second width W2 may be less than the first width W1. Hereinafter, some example embodiments in which the second width W2 is less than the first width W1 will be described. However, the inventive concepts are not limited thereto. In some example embodiments, the second width W2 may be greater than the first width W1. Specific configurations of the first and second ending cells 131 and 132 will be described below with reference to FIGS. 3A to 5B.

Conventionally, the same ending cells are arranged in both a left edge region and a right edge region of the first area 150. Thus, the width of each of ending cells arranged in the left edge region of the first area 150 may be equal to the width of each of ending cells arranged in the right edge region of the first area 150. However, according to the present example embodiment, the second ending cells 132 may be asymmetrically implemented by removing at least some devices or features that are present in the first ending cells 131. Accordingly, the width of the first area 150 may be reduced as compared with conventional arts, thereby reducing the total size of the integrated circuit 100 as compared with conventional arts.

The third ending cells 133 represented by 'D' may be arranged in left corner regions of the first area 150. Each of the third ending cells 133 may have the first width W1 in the first direction. In an example embodiment, each of the third ending cells 133 may further include some devices or features as compared to the first ending cells 131. However, the inventive concepts are not limited thereto. In some example embodiments, the third ending cells 133 may be substantially the same as the first ending cells 131. In FIG. 2, the second ending cells 132 are arranged in the right corner regions of the first area 150. However, the inventive concepts are not limited thereto. In some example embodiments, ending cells that further include some devices or features as compared with the second ending cells 132 may be arranged in the right corner regions. The fourth ending cells 134 represented by 'C' may be arranged in upper and lower edge regions of the first area 150.

The first macroblock 110 and each of the first ending cells 131 may be spaced apart from each other by a first space SP1 in the first direction, and the second macroblock 120 and each of the second ending cells 132 may be spaced apart from each other by a second space SP2 in the first direction. In an example embodiment, the first and second spaces SP1 and SP2 may be equal to each other. However, the inventive concepts are not limited thereto. In some example embodiments, the first and second spaces SP1 and SP2 may be different from each other.

Figure 3A:
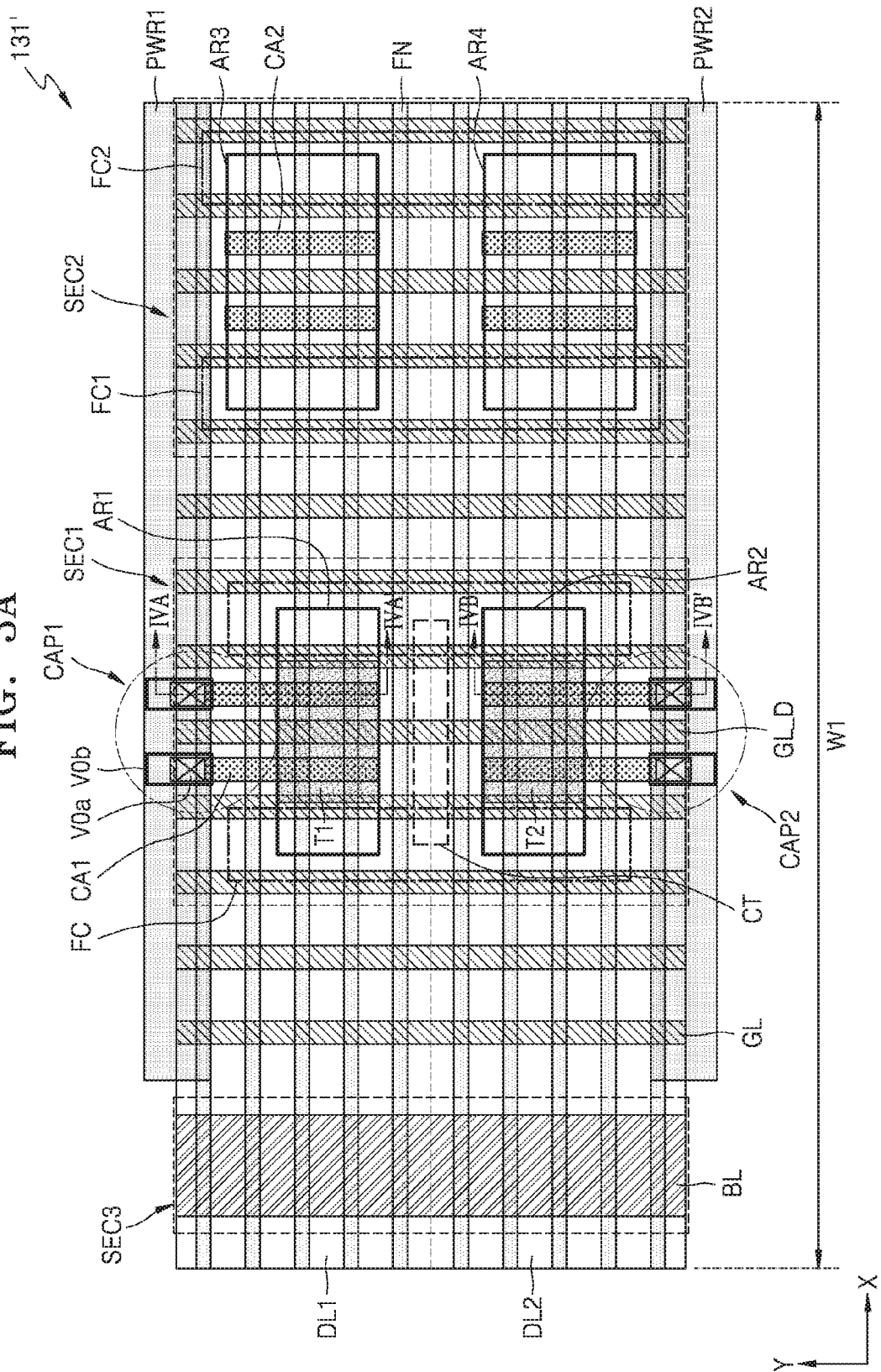

FIG. 3A is a layout illustrating an example 131' of the first ending cell 131 in FIG. 2.

Referring to FIGS. 2 and 3A, the first ending cell 131' may include first to third sections SEC1 to SEC3, and may have a first width W1 in a first direction (e.g., the X direction). For example, the first ending cell 131' may include first and second definition layers DL1 and DL2, first to fourth active regions AR1 to AR4, a plurality of fins FN, and a plurality of gate lines GL. First and second power rails PWR1 and PWR2 extending in the first direction may be arranged above the first ending cell 131'. For example, the first and second power rails PWR1 and PWR2 may be implemented with a first metal layer. For example, a power supply voltage VDD may be applied to the first power rail PWR1 and a ground voltage VSS may be applied to the second power rail PWR2. However, the inventive concepts are not limited thereto.

In an example embodiment, the first definition layer DL1 may be a PMOS definition layer and the second definition layer DL2 may be an NMOS definition layer. For example, the first definition layer DL1 may correspond to an N-type well region and the second definition layer DL2 may correspond to a P-type substrate region. The first and second definition layers DL1 and DL2 may extend in the first direction. Accordingly, in the case that the standard cell 135 is arranged on the right side of the first ending cell 131, PMOS transistors may be formed on the first definition layer DL1 and NMOS transistors may be formed on the second definition layer DL2. However, the inventive concepts are not limited thereto. In some example embodiments, the first definition layer DL1 may be an NMOS definition layer and the second definition layer DL2 may be a PMOS definition layer. For example, the first definition layer DL1 may correspond to the P-type substrate region and the second definition layer DL2 may correspond to the N-type well region. In this case, in the case that the standard cell 135 is arranged on the right side of the first ending cell 131, NMOS transistors may be formed on the first definition layer DL1 and PMOS transistors may be formed on the second definition layer DL2.

The first to fourth active regions AR1 to AR4 may extend in the first direction. The first active region AR1 and the second active region AR2 may be spaced apart from each other in a second direction (e.g., the Y direction) substantially perpendicular to the first direction, and may be of different conductivity types. The third active region AR3 and the fourth active region AR4 may be spaced apart from each other in the second direction, and may be of different conductivity types. The first to fourth active regions AR1 to AR4 may be referred to as diffusion regions.

The plurality of fins FN may extend in the first direction and may be arranged parallel to each other. Further, the plurality of fins FN may be spaced apart from each other at regular intervals in the second direction. The plurality of gate lines GL may extend in the second direction and may be arranged parallel to each other. Further, the plurality of gate lines GL may be spaced apart from each other at regular intervals in the first direction. In this case, the plurality of gate lines GL may correspond to gate electrodes of a semiconductor device.

The first section SEC1 may include the first and second active regions AR1 and AR2, first and second taps T1 and T2, a plurality of contacts CAL and vias V0a and V0b. The first section SEC1 may further include a cutting region CT extending in the first direction to cut the plurality of gate lines GL, and fin cutting regions FC extending in the second direction to cut the plurality of fins FN.

The first and second taps T1 and T2 may be arranged on the first and second active regions AR1 and AR2, respectively. The first and second taps T1 and T2 may include any material having electrical conductivity. The first tap T1 may receive the power supply voltage VDD applied to the first power rail PWR1 and thus may provide the power supply voltage VDD to the first active region AR1. The second tap T2 may receive the ground voltage VSS applied to the second power rail PWR2 and thus may provide the ground voltage VSS to the second active region AR2. Accordingly, the first and second taps T1 and T2 may be referred to as first and second ties. For example, the first tap T1 may be referred to as a well tap or a well tie, and the second tap T2 may be referred to as a substrate tap or a substrate tie.

The contacts CA1 may be arranged on the first and second taps T1 and T2 and extend in the second direction. For example, two contacts CA1 on the first tap T1 may extend to the first power rail PWR1 across the first tap T1, and two contacts CA1 on the second tap T2 may extend to the second power rail PWR2 across the second tap T2. The vias V0a may be arranged on the contacts CAL respectively and the vias V0b may be arranged on the vias V0a, respectively. The first and second power rails PWR1 and PWR2 extending in the first direction may be arranged on the vias V0b. The contacts CAL the vias V0a and V0b, and the first and second power rails PWR1 and PWR2 may each include any material having electrical conductivity, for example, tungsten. The first section SEC1 will be described in more detail with reference to FIG. 4.

The second section SEC2 may include the third and fourth active regions AR3 and AR4 and dummy contacts CA2. The dummy contacts CA2 may include any material having electrical conductivity, like the contacts CA1. However, the dummy contacts CA2 may not be connected to a metal layer and thus may function as dummy contacts rather than as real contacts. The dummy contacts CA2 may ensure contacts in the standard cell 135 arranged on the right side of the first ending cell 131 to be stably formed by processes. Further, the second section SEC2 may further include fin cutting regions FC1 and FC2 extending in the second direction and cutting the plurality of fins FN. For example, the fin cutting region FC1 may be arranged to overlap a left partial region of the third and fourth active regions AR3 and AR4 and may extend in the second direction (e.g., the Y direction). Further, for example, the fin cutting region FC2 may be arranged to overlap a right partial region of the third and fourth active regions AR3 and AR4 and may extend in the second direction.

The third section SEC3 may include a blocking layer BL. The blocking layer BL may extend in the second direction and may be arranged in parallel with the gate lines GL. The width of the blocking layer BL in the first direction may be greater than the width of each of the gate lines GL in the first direction. The blocking layer BL may be a layer for protecting the gate lines GL arranged in an edge region of the first area 150. For example, the blocking layer BL may ensure the gate lines GL to be stably formed by processes. In an example embodiment, the blocking layer BL may be implemented with the same material as the gate lines GL, and may have the same height as the gate lines GL. However, the inventive concepts are not limited thereto.

FIG. 3B is a layout illustrating another example 131" of the first ending cell 131 in FIG. 2.

Referring to FIG. 3B, the first ending cell 131" corresponds to a modification of the first ending cell 131' of FIG. 3A. For example, a second section SEC2 of the first ending cell 131" of FIG. 3B may be different from the second section SEC2 of the first ending cell 131' of FIG. 3A. The description given above with reference to FIG. 3A may also be applied to the present example embodiment, and redundant description will be omitted. For example, the second section SEC2 of the first ending cell 131" may include third and fourth active regions AR3 and AR4, dummy contacts CA2, a fin cutting region FC1, and an active cutting region RC1. For example, the active cutting region RC1 may be arranged on a gate line GL1 and extend in a second direction (e.g., the Y direction). In an example embodiment, the fin cutting region FC1 may be formed with a deep trench region and the active cutting region RC1 may be formed with a shallow trench region. Accordingly, the width of the fin cutting region FC1 in a first direction (e.g., the X direction) may be greater than the width of the active cutting region RC1 in the first direction.

Figure 4:
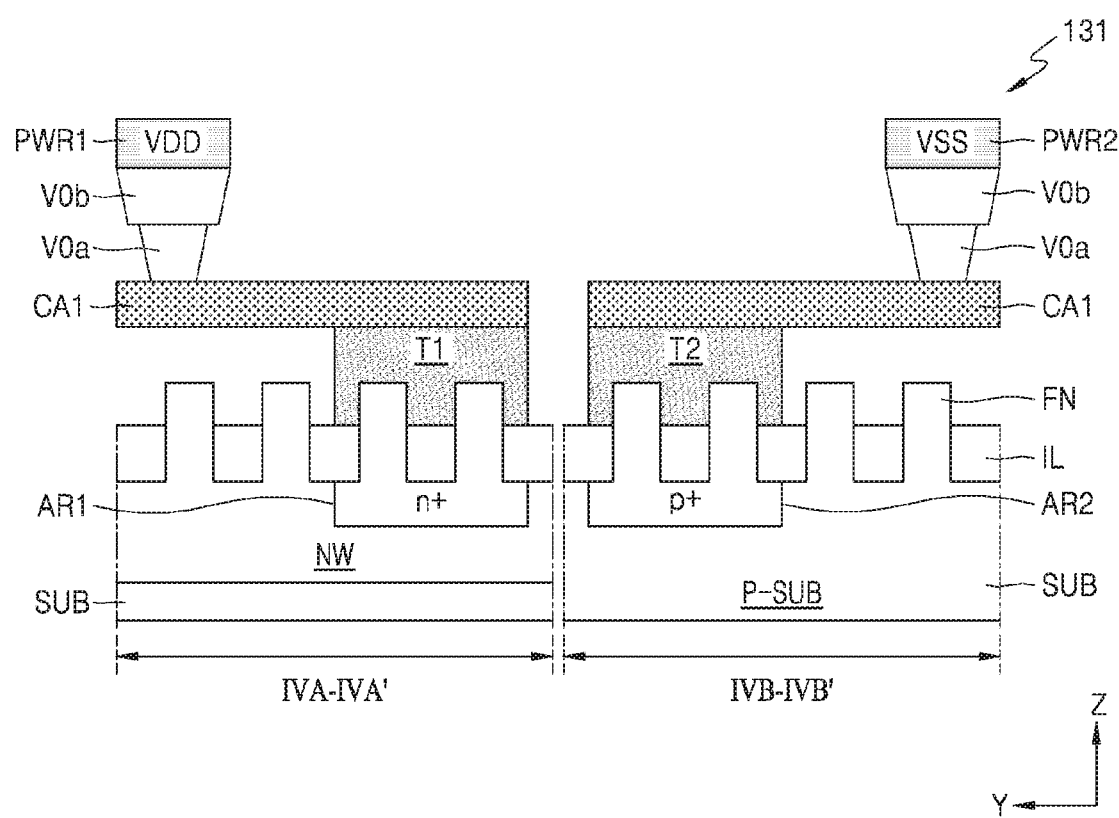
FIG. 4 is a cross-sectional view taken along line IVA-IVA' and line IVB-IVB' in FIG. 3A.

FIG. 4 is a cross-sectional view taken along line IVA-IVA' and line IVB-IVB' in FIG. 3A. Hereinafter, the first section SEC1 will be described in detail with reference to FIGS. 2 to 4.

A substrate SUB may be, for example, a P-type substrate. The substrate SUB may be a semiconductor substrate. For example, the semiconductor substrate may include any one selected from among silicon, silicon-on-insulator (SOI), silicon-on-sapphire, germanium, silicon-germanium, and gallium-arsenide. An N-type well NW may be arranged on a partial region of the substrate SUB corresponding to the first definition layer DL1. The first active region AR1 may be a region doped with, for example, n+ impurities and the second active region AR2 may be a region doped with, for example, p+ impurities.

An insulating layer IL may be arranged above the substrate SUB, and the insulating layer IL may function as a device isolation layer between the plurality of fins FN. The insulating layer IL may include an insulating material, for example, oxide, nitride, or oxynitride. The fins FN may protrude in a fin shape above the insulating layer IL. Although the vias V0a and V0b connected to each other are shown in FIGS. 3A and 4, the inventive concepts are not limited thereto, and only one via may be provided between the contact CA1 and the first or second power rail PWR1 or PWR2.

In the case of a PMOS transistor, a parasitic diode may be generated between an N-type well NW and a source/drain to be arranged in a region doped with p+ impurities, thereby deteriorating operating characteristics of the PMOS transistor. In this case, by maintaining the voltage of the N-type well NW corresponding to a cathode of the parasitic diode higher than the voltage of the source/drain corresponding to an anode of the parasitic diode, a reverse bias may be applied to the parasitic diode. In the present example embodiment, the first tap T1 may be arranged in the first active region AR1 on the N-type well NW and be connected to the first power rail PWR1 to which the power supply voltage VDD is applied. Thus, the voltage of the N-type well NW may be fixed to the power supply voltage VDD through the first tap T1, a forward bias may not be applied to the parasitic diode, the parasitic diode may be opened, and a latch-up may not occur.

In the case of an NMOS transistor, a parasitic diode may be generated between a P-type substrate SUB and a source/drain to be arranged in a region doped with n+ impurities, thereby deteriorating operating characteristics of the NMOS transistor. In this case, by maintaining the voltage of the P-type substrate SUB corresponding to an anode of the parasitic diode lower than the voltage of the source/drain corresponding to a cathode of the parasitic diode, a reverse bias may be applied to the parasitic diode. In the present example embodiment, the second tap T2 may be arranged in the second active region AR2 on the P-type substrate SUB and be connected to the second power rail PWR2 to which the ground voltage VSS is applied. Thus, the voltage of the P-type substrate SUB may be fixed to the ground voltage VSS through the second tap T2, a forward bias may not be applied to the parasitic diode, the parasitic diode may be opened, and a latch-up may not occur.

According to the present example embodiment, the first and second taps T1 and T2 may be arranged on the first and second active regions AR1 and AR2, respectively, in the first section SEC1 of the first ending cell 131. Accordingly, it is possible to mitigate or prevent current from flowing through parasitic diodes in a substrate/well junction in the standard cells 135 arranged in the central region of the first area 150. In this manner, the first ending cell 131 may be arranged in the first area 150 to mitigate or prevent a latch-up from occurring in the standard cells 135. As a result, the performance of the integrated circuit 100 may be improved.

The first section SEC1 may include first and second capacitors CAP1 and CAP2. For example, a gate line GL_D between the contacts CA1 may be a dummy gate line, and thus, the two contacts CA1 and the gate line GL_D on the first active region AR1 may constitute the first capacitor CAP1 and the two contacts CA1 and the gate line GL_D on the second active region AR2 may constitute the second capacitor CAP2. In this case, the first and second capacitors CAP1 and CAP2 may function as decoupling capacitors. By using the first and second capacitors CAP1 and CAP2, voltage noise in the integrated circuit 100 may be reduced.

Figure 5A:
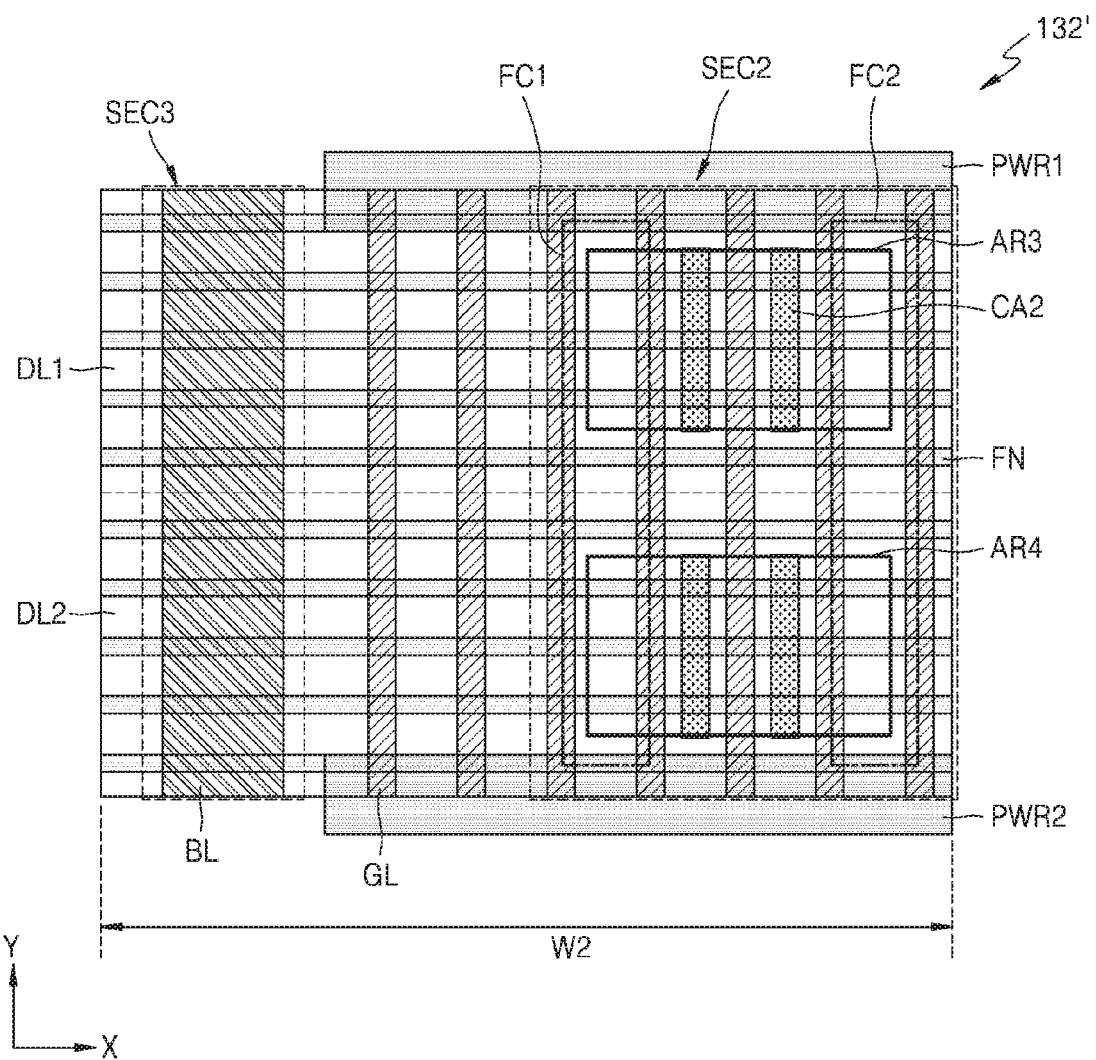
FIGS. 5A and 5B are layouts illustrating examples of a second ending cell in FIG. 2.

FIG. 5A is a layout illustrating an example 132' of the second ending cell 132 in FIG. 2.

Referring to FIGS. 2 and 5A, the second ending cell 132' may include second and third sections SEC2 and SEC3. In other words, the second ending cell 132' may have a configuration in which the first section SEC1 is removed from the first ending cell 131, and thus a second width W2 of the second ending cell 132' may be less than the first width W1 of the first ending cell 131.

Conventionally, ending cells arranged in the left edge region and right edge region of the first area 150 are symmetrically implemented. However, according to the present example embodiment, considering that the width of the first area 150 in the first direction is considerably narrow, the first section SEC1 may be included only in the first ending cells 131 from among the first and second ending cells 131 and 132. The description given above with reference to FIG. 3A may also be applied to the present example embodiment, and redundant description will be omitted.

Figure 5B:
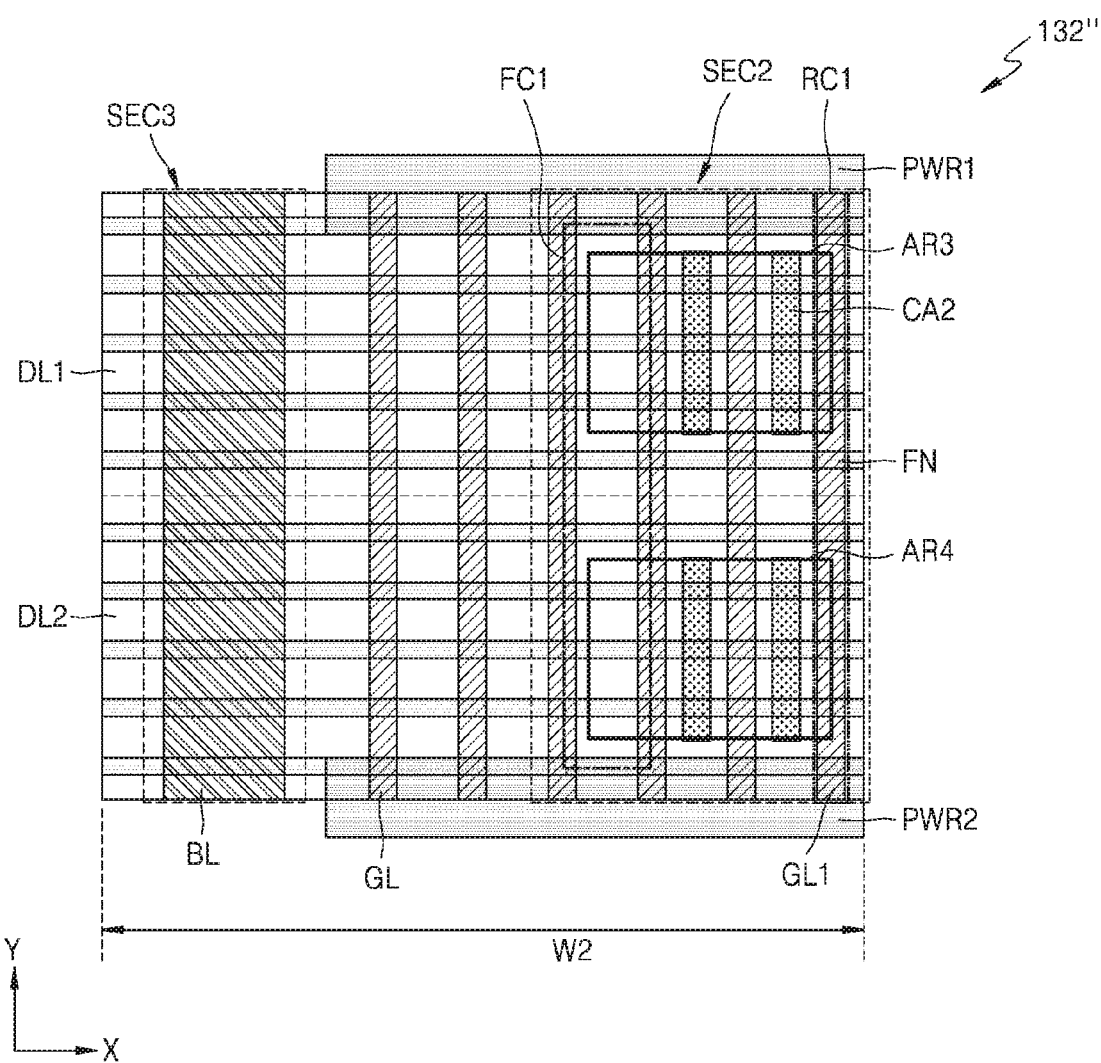

FIG. 5B is a layout illustrating another example 132" of the second ending cell 132 in FIG. 2.

Referring to FIG. 5B, the second ending cell 132" corresponds to a modification of the second ending cell 132' in FIG. 5A. For example, a second section SEC2 of the second ending cell 132" of FIG. 5B may be different from the second section SEC2 of the second ending cell 132' of FIG. 5A. The description given above with reference to FIG. 5A may also be applied to the present example embodiment, and redundant description will be omitted. For example, the second section SEC2 of the second ending cell 132" may include third and fourth active regions AR3 and AR4, dummy contacts CA2, a fin cutting region FC1, and an active cutting region RC1. For example, the active cutting region RC1 may be arranged on a gate line GL1 and extend in the second direction (e.g., the Y direction).

FIG. 6 illustrates an example 100a of an integrated circuit according to an example embodiment of the inventive concepts.

Referring to FIG. 6, the integrated circuit 100a may be an example of the integrated circuit 100 of FIG. 2, and the description given above with reference to FIGS. 2 to 5B may be applied to the present example embodiment. A plurality of cells 130a may be arranged in a first area 150a between first and second macroblocks 110 and 120. The width of the first area 150a in a first direction (e.g., the X direction) may be narrower than the width of the first area 150 of FIG. 2 in the first direction. The plurality of cells 130a may include first to fourth ending cells 131a to 134 arranged in an edge region of the first area 150a and a plurality of standard cells 135 arranged in the central region of the first area 150a.

The first ending cells 131a and the second ending cells 132a may be implemented with asymmetric ending cells. The first ending cells 131a may be arranged adjacent to the first macroblock 110 and may be arranged in a line in a second direction (e.g., the Y direction). Each of the first ending cells 131a may have a first width W1' in the first direction. The second ending cells 132a may be arranged adjacent to the second macroblock 120 and may be arranged in a line in the second direction. Each of the second ending cells 132a may have a second width W2' in the first direction. The first width W1' may be different from the second width W2'.

Each of the first ending cells 131a may be implemented such that some devices or features in each of the first ending cells 131 of FIG. 2 are omitted. Accordingly, the first width W1' may be less than the first width W1 in FIG. 2. Each of the second ending cells 132a may be implemented such that some devices or features in each of the second ending cells 132 of FIG. 2 are omitted. Accordingly, the second width W2' may be less than the second width W2 in FIG. 2. Hereinafter, various example embodiments of the configuration of the first and second ending cells 131a and 131b will be described in detail with reference to FIGS. 7A to 8B.

FIG. 7A is a layout illustrating an example 131a' of the first ending cell 131a in FIG. 6.

Referring to FIG. 7A, the first ending cell 131a' may include first and second sections SEC1 and SEC2. For example, the first ending cell 131a' may have a configuration in which the third section SEC3 is removed from the first ending cell 131' of FIG. 3A. Thus, a first width W1' of the first ending cell 131a' may be less than the first width W1 of the first ending cell 131'. When the first macroblock 110 includes a blocking layer in a right edge region thereof, the first ending cell 131a' may be implemented as shown in FIG. 7A so as not to include the blocking layer. Because the blocking layer are provided in one of the first macroblock 110 and the first ending cell 131a', the width of the first area 150a may be reduced compared to the first area 150.

Further, the first ending cell 131a' may further include a fin cutting region FC3. The fin cutting region FC3 may be arranged in a left boundary region of the first ending cell 131a' and extend in the second direction (e.g., the Y direction). As such, the first ending cell 131a' may include a fin cutting region FC2 in a right boundary region and the fin cutting region FC3 in the left boundary region.

Figure 7B:
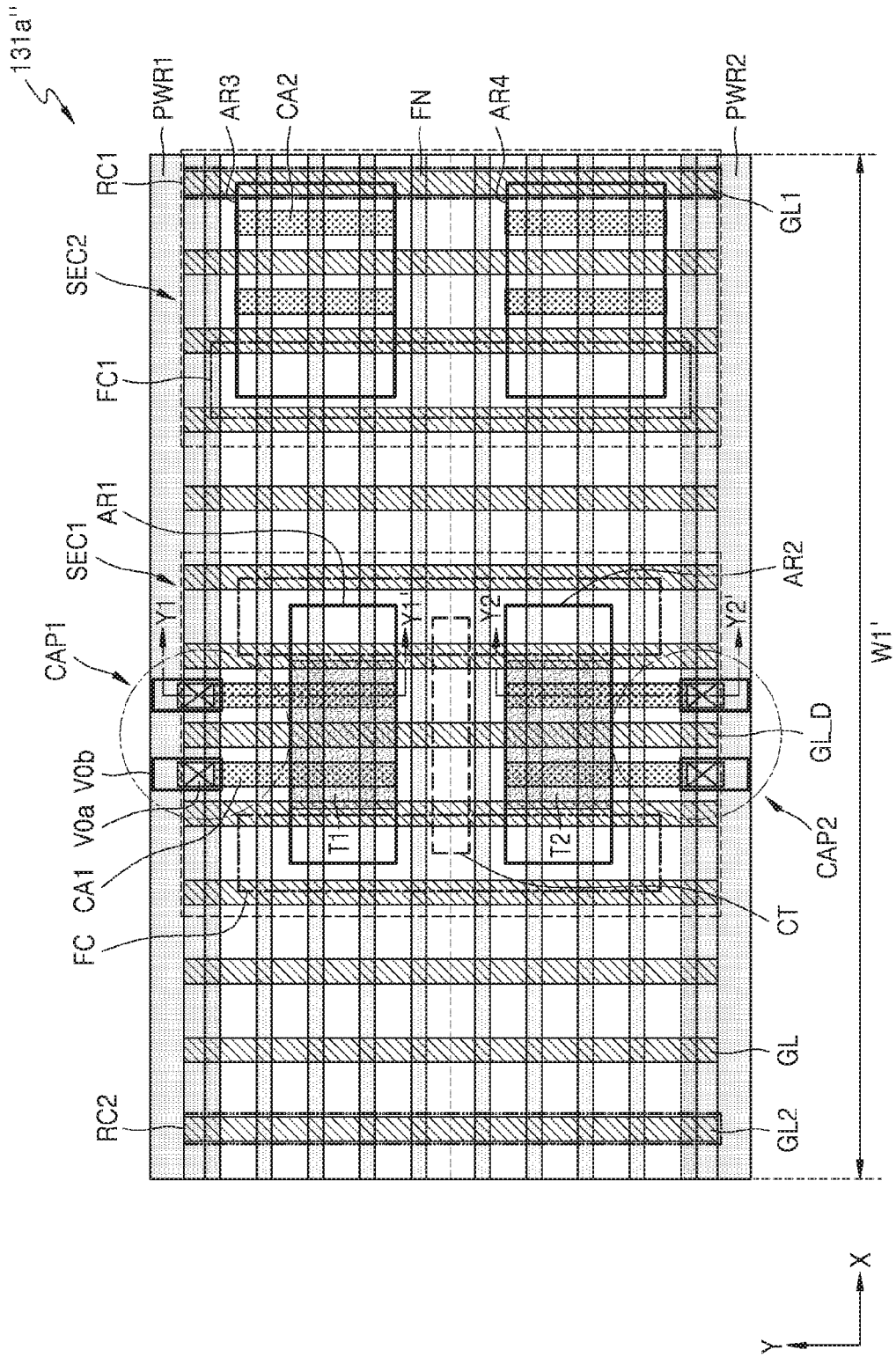

FIG. 7B is a layout illustrating another example 131a" of the first ending cell 131a in FIG. 6.

Referring to FIG. 7B, the first ending cell 131a" corresponds to a modification of the first ending cell 131a' of FIG. 7A. For example, a second section SEC2 of the first ending cell 131a" of FIG. 7B may be different from the second section SEC2 of the first ending cell 131a' of FIG. 7A. The description given above with reference to FIG. 7A may also be applied to the present example embodiment, and redundant description will be omitted. For example, the second section SEC2 of the first ending cell 131a" may include third and fourth active regions AR3 and AR4, dummy contacts CA2, a fin cutting region FC1, and an active cutting region RC1. For example, the active cutting region RC1 may be arranged on a gate line GL1 and extend in a second direction (e.g., the Y direction).

The first ending cell 131a" may further include an active cutting region RC2. The active cutting region RC2 may be arranged on a gate line GL2 in a left boundary region of the first ending cell 131a" and may extend in the second direction (e.g., the Y direction). As such, the first ending cell 131a" may include the active cutting region RC1 in a right boundary region and the active cutting region RC2 in the left boundary region.

Figure 8A:
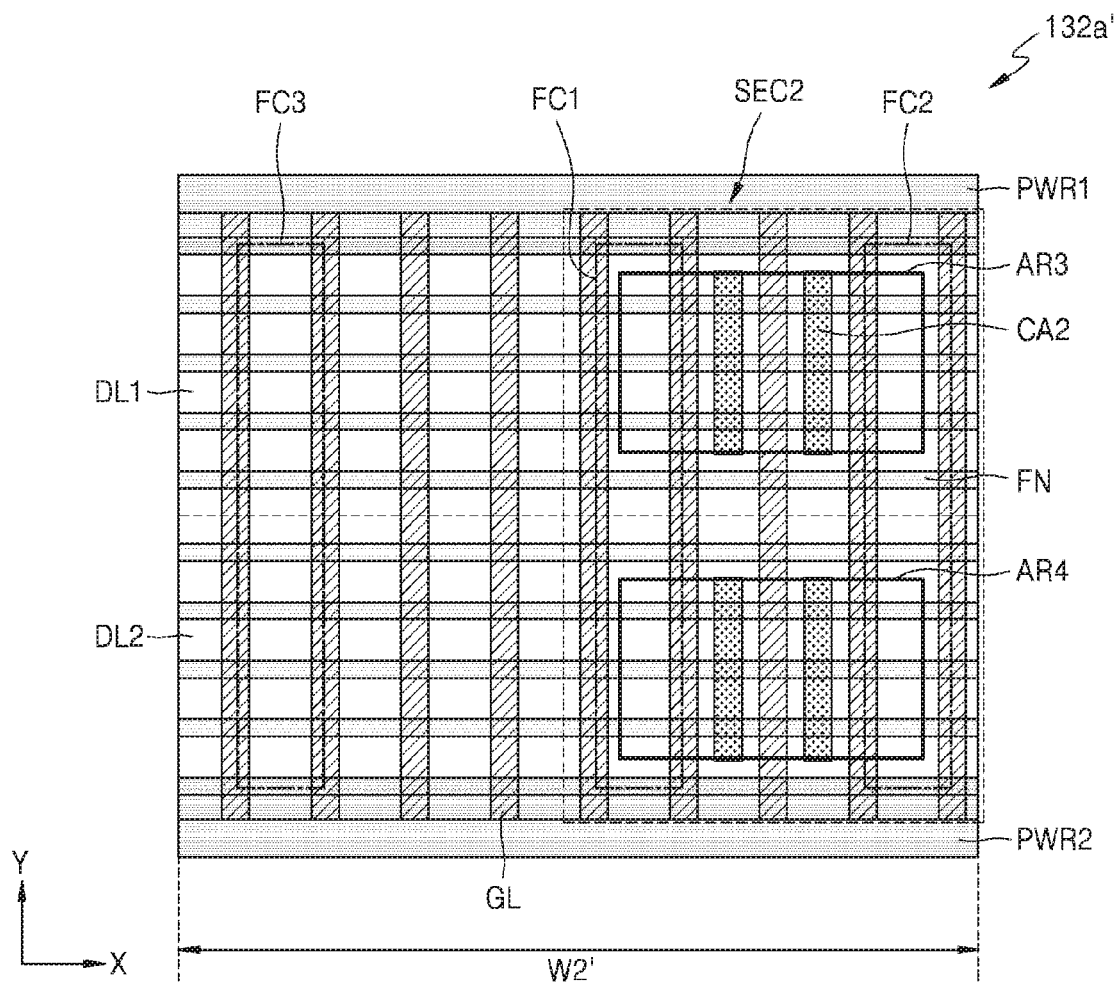
FIGS. 8A and 8B are layouts illustrating examples of a second ending cell in FIG. 6.

FIG. 8A is a layout illustrating an example 132a' of the second ending cell 132a in FIG. 6.

Referring to FIG. 8A, the second ending cell 132a' may include a second section SEC2. For example, the second ending cell 132a' may have a configuration in which the third section SEC3 is removed from the second ending cell 132' of FIG. 5A, and thus a second width W2' of the second ending cell 132a' may be less than the second width W2 of the second ending cell 132'. When the second macroblock 120 includes a blocking layer in a left edge region thereof, the second ending cell 132a' may be implemented as shown in FIG. 8A so as not to include the blocking layer. Because the blocking layer is provided in one of the second macroblock 120 and the second ending cell 132a', the width of the first area 150a may be further reduced compared to the first area 150.

Further, the second ending cell 132a' may further include a fin cutting region FC3. The fin cutting region FC3 may be arranged in a left boundary region of the second ending cell 132a' and may extend in a second direction (e.g., the Y direction). As such, the second ending cell 132a' may include a fin cutting region FC2 in a right boundary region and the fin cutting region FC3 in the left boundary region.

Figure 8B:
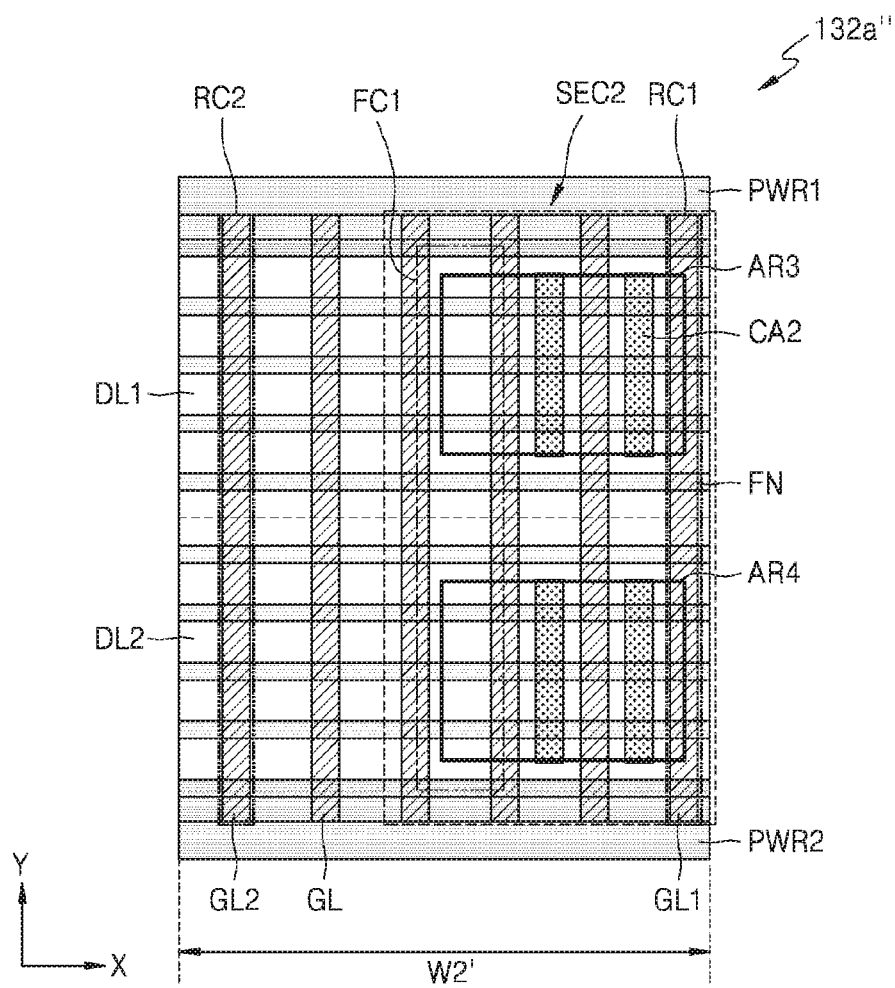

FIG. 8B is a layout illustrating another example 132a'' of the second ending cell 132a in FIG. 6.

Referring to FIG. 8B, the second ending cell 132a'' corresponds to a modification of the second ending cell 132a' of FIG. 8A. For example, a second section SEC2 of the second ending cell 132a'' of FIG. 8B may be different from the second section SEC2 of the second ending cell 132a' of FIG. 8A. The description given above with reference to FIG. 8A may also be applied to the present example embodiment, and redundant description will be omitted. For example, the second section SEC2 of the second ending cell 132a'' may include third and fourth active regions AR3 and AR4, dummy contacts CA2, a fin cutting region FC1, and an active cutting region RC1. For example, the active cutting region RC1 may be arranged on a gate line GL1 and extend in a second direction (e.g., the Y direction).

The second ending cell 132a'' may further include an active cutting region RC2. The active cutting region RC2 may be arranged on a gate line GL2 in a left boundary region of the second ending cell 132a'' and may extend in the second direction (e.g., the Y direction). As such, the second ending cell 132a'' may include the active cutting region RC1 in a right boundary region and the active cutting region RC2 in the left boundary region.

FIG. 9A illustrates an example 100b of an integrated circuit according to an example embodiment of the inventive concepts.

Referring to FIG. 9A, the integrated circuit 100b may correspond to an alternative example embodiment of the integrated circuit 100 of FIG. 2, and the description given above with reference to FIGS. 2 to 5B may also be applied to the present example embodiment. A first macroblock 110 may be in contact with or border first ending cells 131 in the first direction. For example, the first space SP1 between the first macroblock 110 and the first ending cells 131 may be removed (e.g., may be zero), as compared to FIG. 2. Further, a second macroblock 120 may be in contact with or border second ending cells 132 in the first direction. For example, the second space SP2 between the second macroblock 120 and the second ending cells 132 may be removed (e.g., may be zero), as compared to FIG. 2. Thus, a distance between the first and second macroblocks 110 and 120 may be reduced compared to that of FIG. 2, and the total size of the integrated circuit 100b may also be reduced.

However, the inventive concepts are not limited thereto. In an example embodiment, the first macroblock 110 may be in contact with or border the first ending cells 131, and the second macroblock 120 and each of the second ending cells 132 may be spaced apart from each other by a second space (e.g., the second space SP2 in FIG. 2). In an example embodiment, the first macroblock 110 and each of the first ending cells 131 may be spaced apart from each other by a first space (e.g., the first space SP1 in FIG. 2) and the second macroblock 120 may be in contact with or border the second ending cells 132.

Figure 9B:
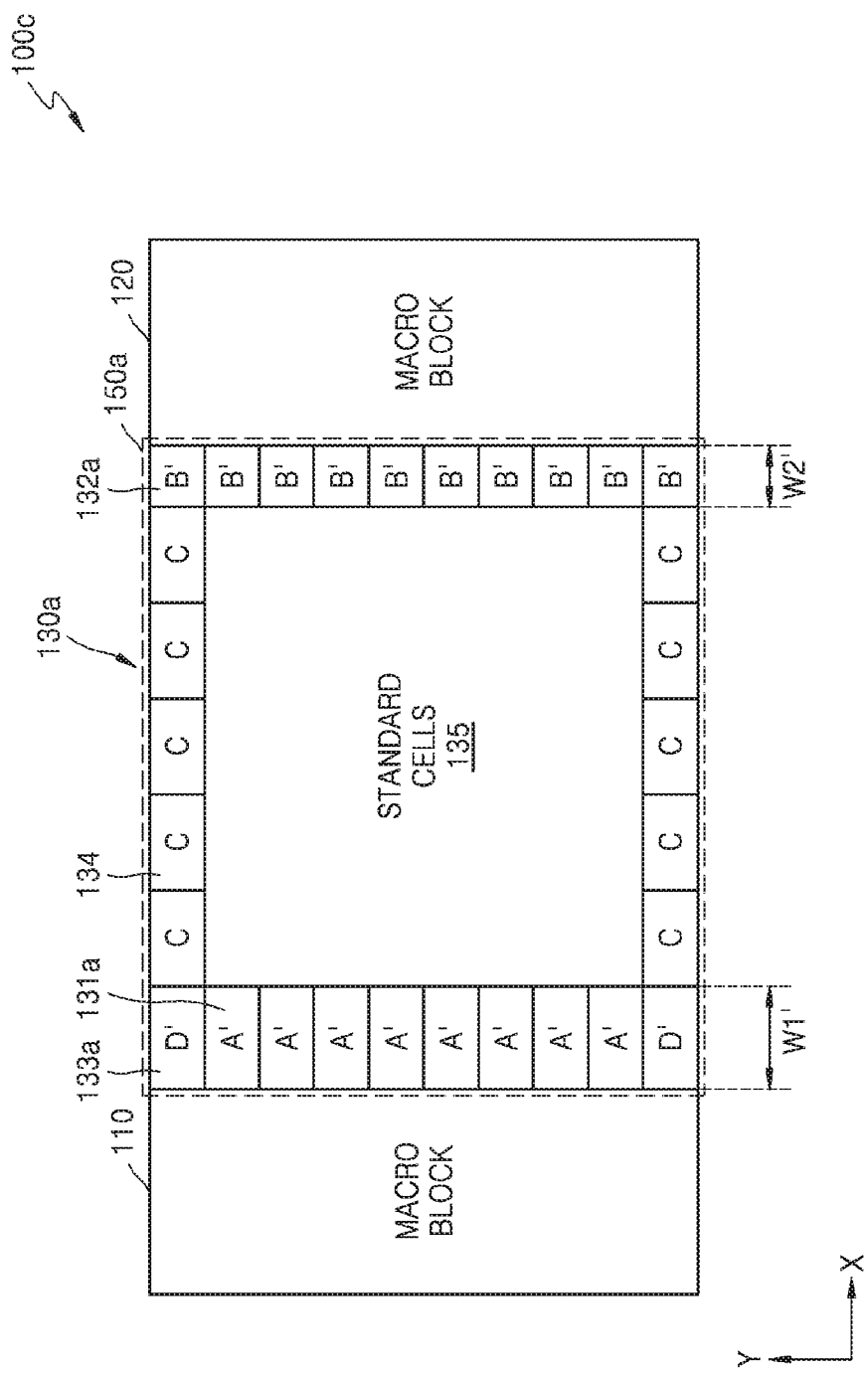

FIG. 9B illustrates an example 100c of an integrated circuit according to an example embodiment of the inventive concepts.

Referring to FIG. 9B, the integrated circuit 100c may be an example of the integrated circuit 100a of FIG. 6, and the description given above with reference to FIGS. 6 to 8B may also be applied to the present example embodiment. A first macroblock 110 may be in contact with or border first ending cells 131a in the first direction. For example, the first space SP1 between the first macroblock 110 and the first ending cells 131a may be removed (e.g., may be zero), as compared to FIG. 6. Further, a second macroblock 120 may be in contact with or border second ending cells 132a in the first direction. For example, the second space SP2 between the second macroblock 120 and the second ending cells 132a may be removed (e.g., may be zero), as compared to FIG. 6. Thus, a distance between the first and second macroblocks 110 and 120 may be reduced compared to that of FIG. 6, and the total size of the integrated circuit 100c may also be reduced.

The first ending cells 131a and the second ending cells 132a may be implemented with asymmetric ending cells. The first ending cells 131a may be arranged adjacent to the first macroblock 110 and may be arranged in a line in a second direction (e.g., the Y direction). Each of the first ending cells 131a may have a first width W1' in the first direction. The second ending cells 132a may be arranged adjacent to the second macroblock 120 and may be arranged in a line in the second direction. Each of the second ending cells 132a may have a second width W2' in the first direction. The first width W1' may be different from the second width W2'.

Each of the first ending cells 131a may be implemented such that some devices or features in each of the first ending cells 131 of FIG. 2 are omitted. Accordingly, the first width W1' may be less than the first width W1 in FIG. 2. Each of the second ending cells 132a may be implemented such that some devices or features in each of the second ending cells 132 of FIG. 2 are omitted. Accordingly, the second width W2' may be less than the second width W2 in FIG. 2.

However, the inventive concepts are not limited thereto. In an embodiment, the first macroblock 110 may be in contact with or border the first ending cells 131a, and the second macroblock 120 and each of the second ending cells 132a may be spaced apart from each other by a second space (e.g., the second space SP2 in FIG. 6). In an example embodiment, the first macroblock 110 and each of the first ending cells 131a may be spaced apart from each other by a first space (e.g., the first space SP1 in FIG. 6) and the second macroblock 120 may be in contact with or border the second ending cells 132a.

Figure 10:
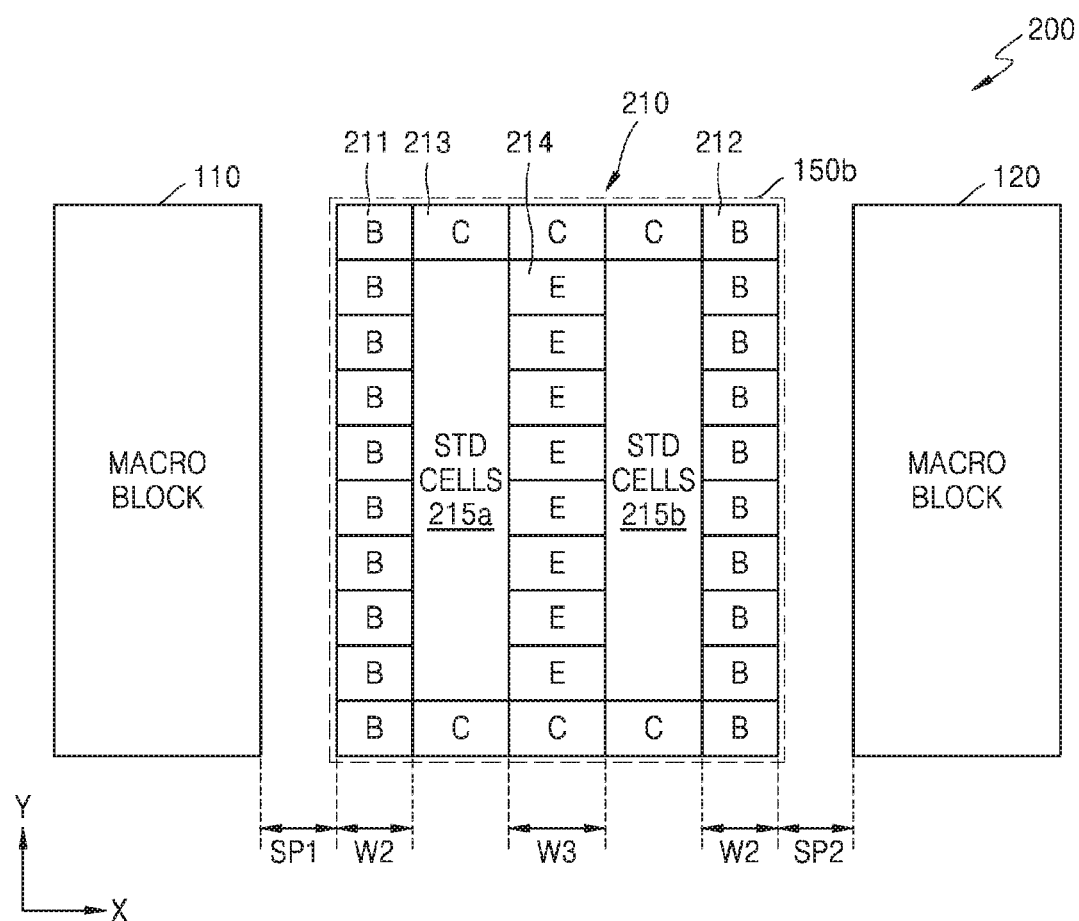
FIG. 10 illustrates an example of an integrated circuit according to an example embodiment of the inventive concepts.

FIG. 10 illustrates an example 200 of an integrated circuit according to an example embodiment of the inventive concepts.

Referring to FIG. 10, the integrated circuit 200 may include first and second macroblocks 110 and 120 arranged in a first direction (e.g., the X direction) and a plurality of cells 210 arranged in a first area 150b between the first and second macroblocks 110 and 120. The plurality of cells 210 may include first to third ending cells 211 to 213 arranged in edge regions of the first area 150b, center cells 214 arranged in a central region of the first area 150b, standard cells 215a arranged between the first ending cells 211 and the center cells 214, and standard cells 215b arranged between the second ending cells 212 and the center cells 214.

The first and second ending cells 211 and 212 may be symmetric ending cells. The first ending cells 211 may be arranged adjacent to the first macroblock 110 and may be arranged in a line in a second direction (e.g., the Y direction). Each of the first ending cells 211 may have a second width W2 in a first direction. The second ending cells 212 may be arranged adjacent to the second macroblock 120 and may be arranged in a line in the second direction. Each of the second ending cells 212 may have a second width W2 in the first direction. The first and second ending cells 211 and 212 may be implemented in the same manner as the second ending cell 132' in FIG. 5A. For example, the first and second ending cells 211 and 212 may not include taps or ties. The third ending cells 213 may be implemented in the same manner as the fourth ending cells 134 of FIG. 2.

The center cells 214 may be arranged in a line between the first ending cells 211 and the second ending cells 212. Each of the center cells 214 may have a third width W3 in the first direction. In an example embodiment, each of the center cells 214 may include taps or ties. In an example embodiment, the third width W3 may be greater than the second width W2. However, the inventive concepts are not limited thereto. In some example embodiments, the third width W3 may be less than the second width W2.

The first macroblock 110 and each of the first ending cells 211 may be spaced apart from each other by a first space SP1 in the first direction, and the second macroblock 120 and each of the second ending cells 222 may be spaced apart from each other by a second space SP2 in the first direction. In an example embodiment, the first and second spaces SP1 and SP2 may be equal to each other. However, the inventive concepts are not limited thereto. In some example embodiments, the first and second spaces SP1 and SP2 may be different from each other.

Figure 11A:
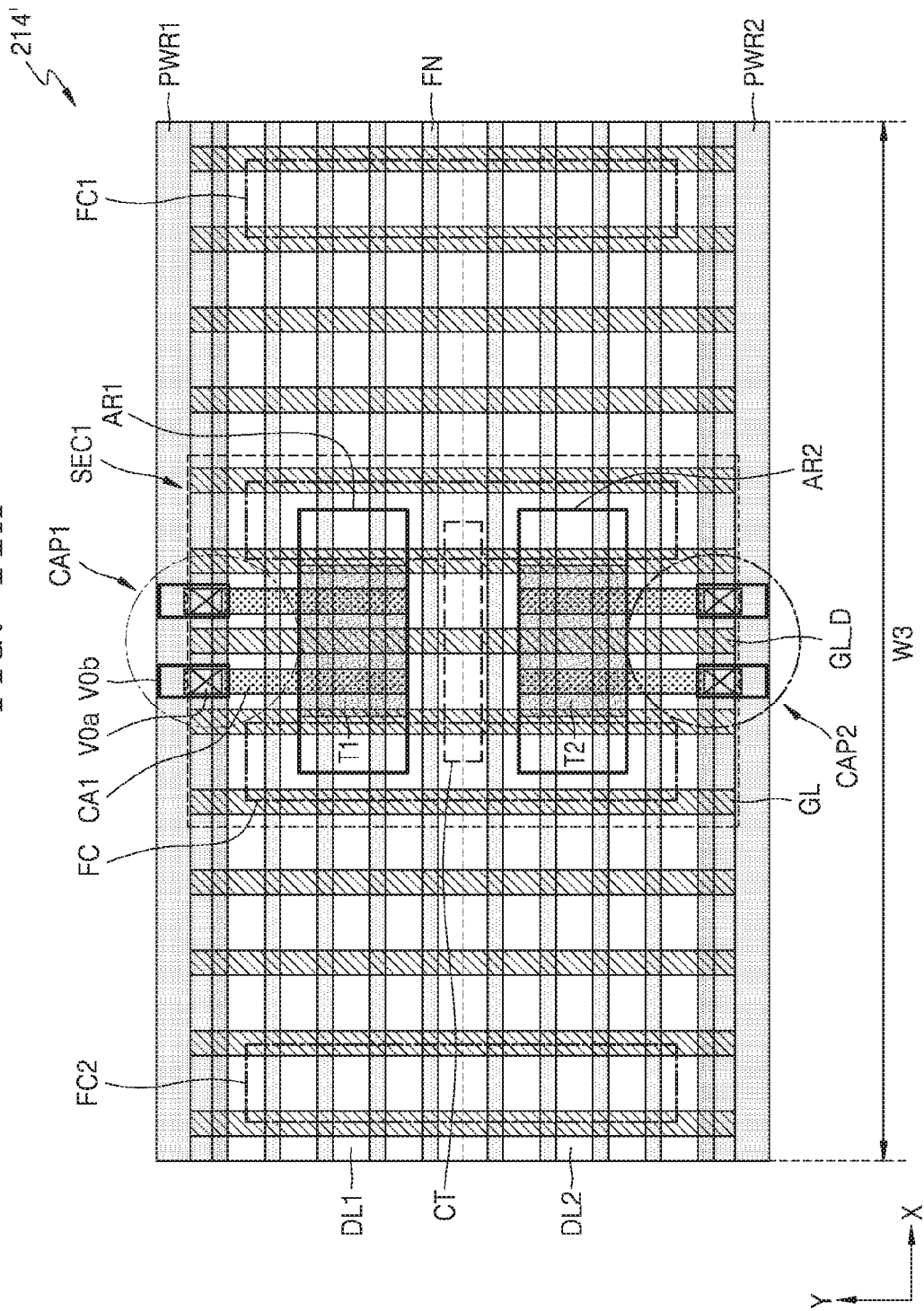
FIGS. 11A and 11B are layouts illustrating examples of a center cell in FIG. 10.

FIG. 11A is a layout illustrating an example 214' of the center cell 214 in FIG. 10.

Referring to FIG. 11A, the center cell 214' may be implemented to include a first section SEC1 and may have a third width W3 in a first direction (e.g., the X direction). For example, the center cell 214' may include first and second definition layers DL1 and DL2, first and second active regions AR1 and AR2, a plurality of fins FN, and a plurality of gate lines GL. The first section SEC1 may be implemented same as or substantially similar to the first section SEC1 in FIG. 3A. According to the present example embodiment, because the center cell 214' includes the first section SEC1, the first and second ending cells 211 and 212 may have a configuration in which the first section SEC1 is removed. Thus, a distance between the first and second macroblocks 110 and 120 may be reduced. Further, the center cell 214' may further include a fin cutting region FC1 and a fin cutting region FC2 in a right boundary region and a left boundary region, respectively.

Figure 11B:
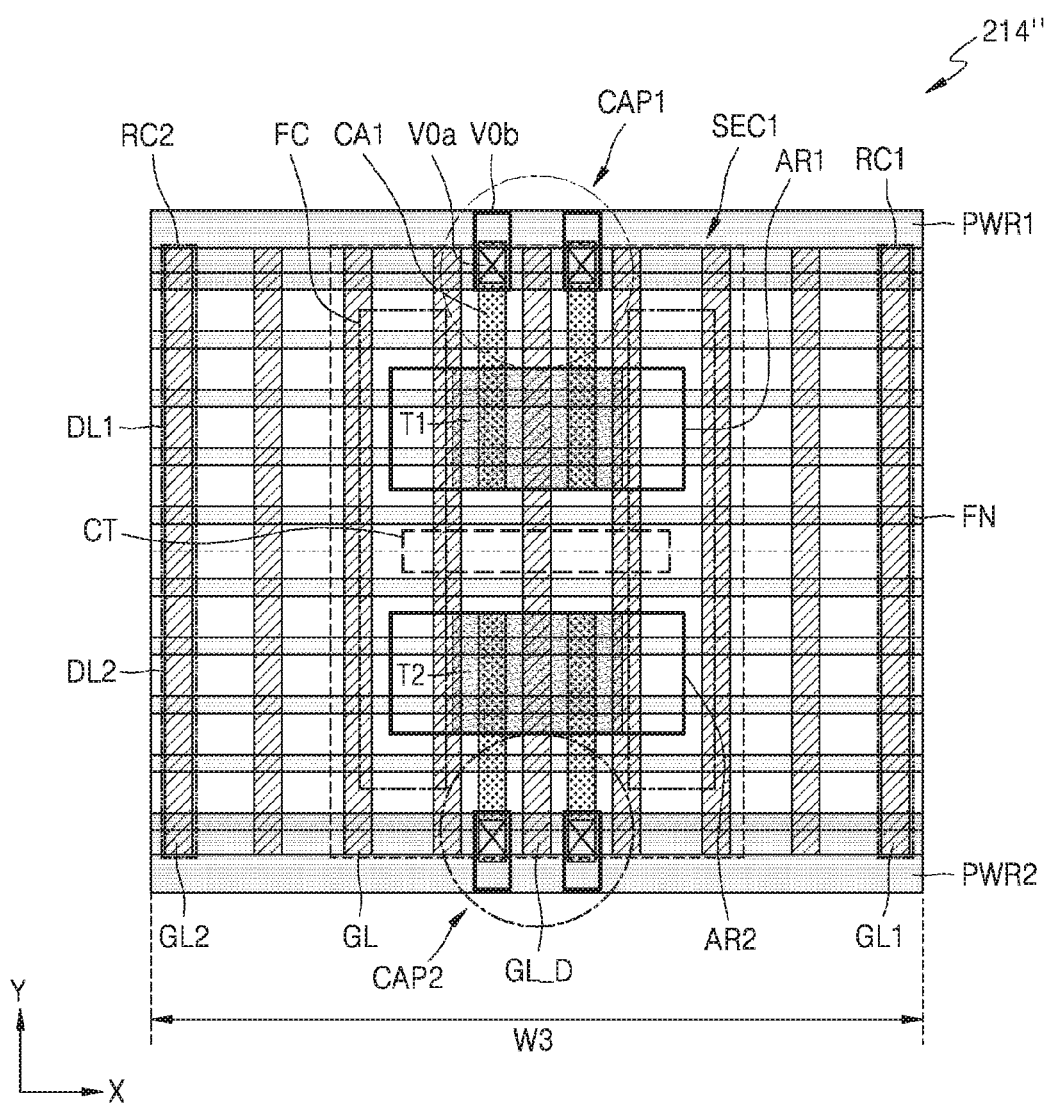

FIG. 11B is a layout illustrating another example 214" of the center cell 214 in FIG. 10.

Referring to FIG. 11B, the center cell 214" may be a modified example of the center cell 214' of FIG. 11A. The description given above with reference to FIG. 11A may also be applied to the present example embodiment, and redundant description will be omitted. For example, the center cell 214" may include active cutting regions RC1 and RC2 instead of the fin cutting regions FC1 and FC3 in the right boundary region and the left boundary region, respectively. The active cutting regions RC1 and RC2 may be arranged on gate lines GL1 and GL2, respectively.

Figure 12:
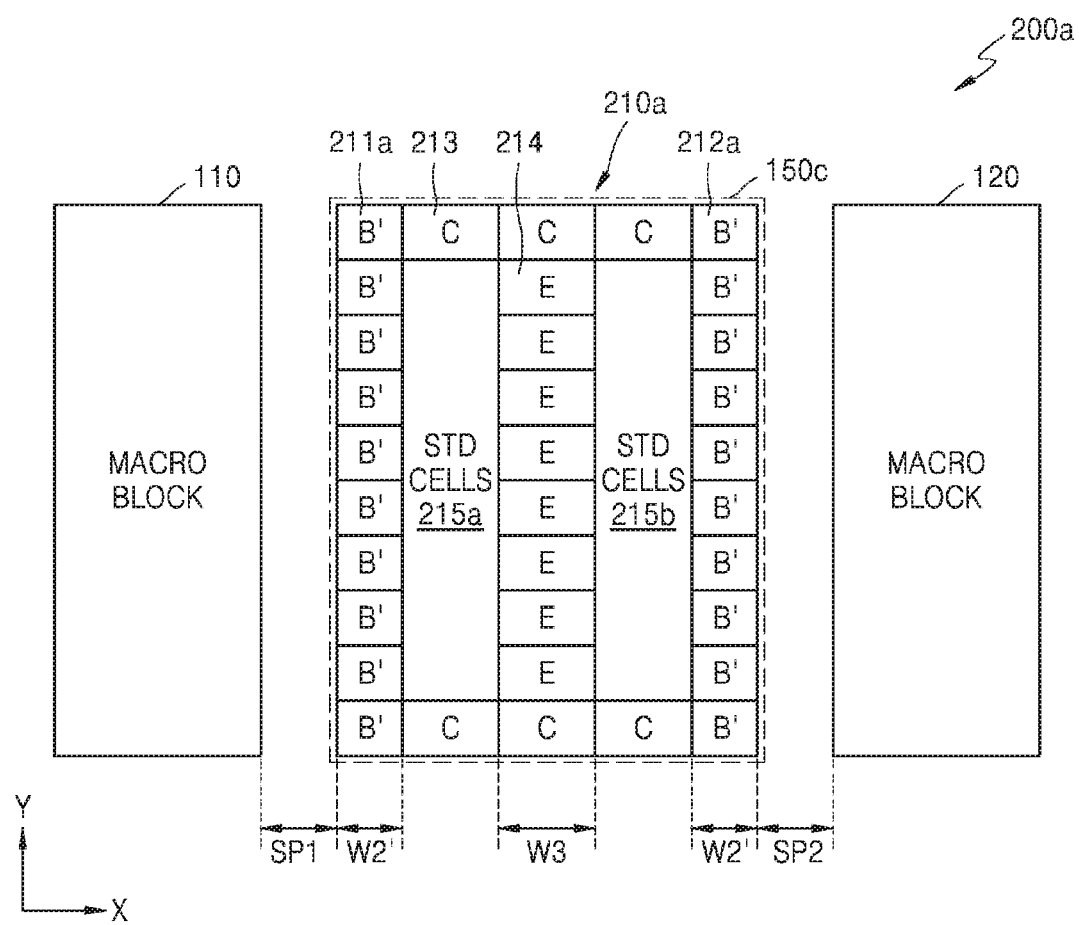
FIG. 12 illustrates an example of an integrated circuit according to an example embodiment of the inventive concepts.

FIG. 12 illustrates an example 200a of an integrated circuit according to an example embodiment of the inventive concepts.

Referring to FIG. 12, the integrated circuit 200a may be an example of the integrated circuit 200 of FIG. 11. A plurality of cells 210a may be arranged in a first area 150c between first and second macroblocks 110 and 120. The width of the first area 150c in a first direction (e.g., the X direction) may be narrower than that of the first area 150b of FIG. 11. The plurality of cells 210a may include first to third ending cells 211a, 212a, and 213 arranged in an edge region of the first area 150c, center cells 214 arranged in a central region of the first area 150c, standard cells 215a arranged between the first ending cells 211a and the center cells 214, and standard cells 215b arranged between the second ending cells 212a and the center cells 214.

The first and second ending cells 211a and 212a may be implemented with symmetric ending cells. The first ending cells 211a may be arranged adjacent to the first macroblock 110 and may be arranged in a line in a second direction (e.g., the Y direction). Each of the first ending cells 211a may have a second width W2' in the first direction. The second ending cells 212a may be arranged adjacent to the second macroblock 120 and may be arranged in a line in the second direction. Each of the second ending cells 212a may have a second width W2' in the first direction. The first and second ending cells 211a and 212a may be implemented in the same manner as or in substantially similar manner to the second ending cell 132a' of FIG. 8A. For example, the first and second ending cells 211a and 212a may not include taps or ties and a blocking layer.

Figure 13A:
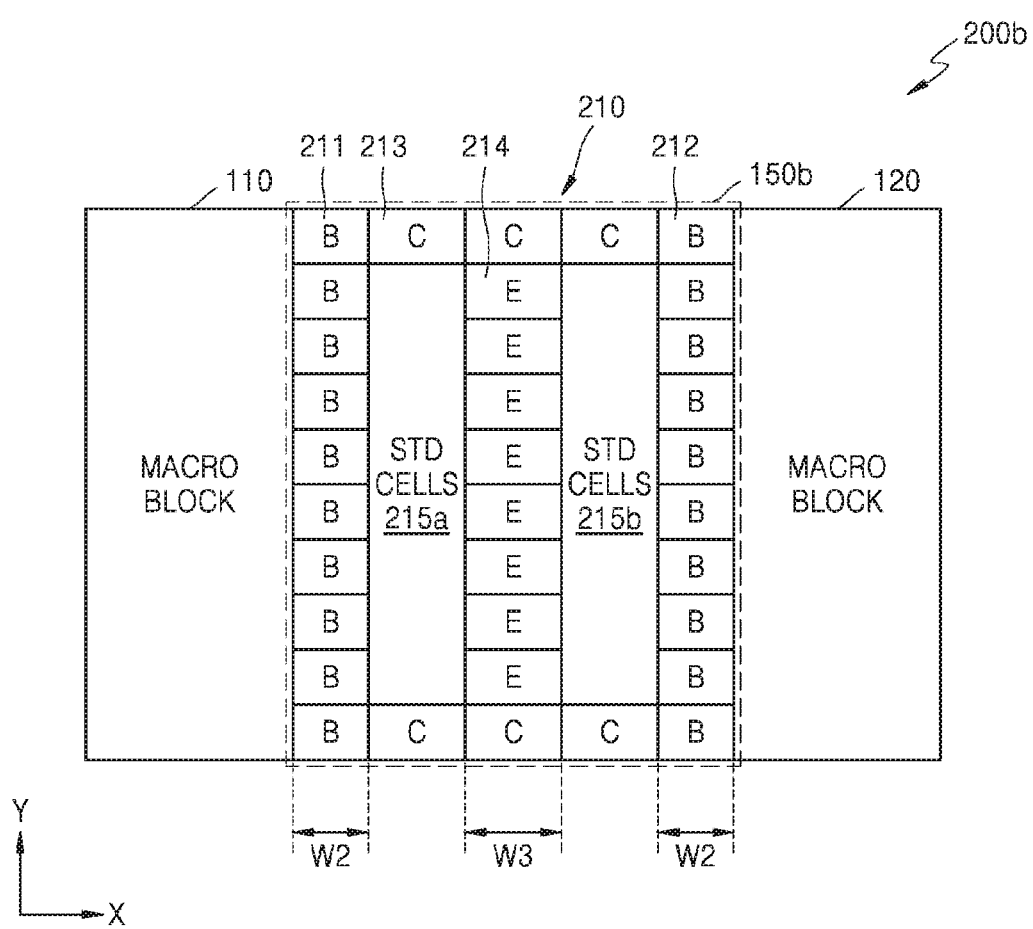
FIGS. 13A and 13B illustrates examples of an integrated circuit according to some example embodiments of the inventive concepts.

FIG. 13A illustrates an example 200b of an integrated circuit according to an example embodiment of the inventive concepts.

Referring to FIG. 13A, the integrated circuit 200b may be an example of the integrated circuit 200 of FIG. 10. A first macroblock 110 may be in contact with or border first ending cells 211 in a first direction (e.g., the X direction). For example, the first space SP1 between the first macroblock 110 and the first ending cells 211 may be removed (e.g., may be zero), as compared to FIG. 10. Further, a second macroblock 120 may be in contact with or border second ending cells 212 in the first direction. For example, the second space SP2 between the second macroblock 120 and the second ending cells 212 may be removed (or may be zero), as compared to FIG. 10. Thus, a distance between the first and second macroblocks 110 and 120 may be reduced compared to that of FIG. 10, and the total size of the integrated circuit 200b may also be reduced.

However, the inventive concepts are not limited thereto. In an example embodiment, the first macroblock 110 may be in contact with or border the first ending cells 211, and the second macroblock 120 and each of the second ending cells 212 may be spaced apart from each other by a second space (e.g., the second space SP2 in FIG. 10). In an example embodiment, the first macroblock 110 and each of the first ending cells 211 may be spaced apart from each other by a first space (e.g., the first space SP1 in FIG. 10) and the second macroblock 120 may be in contact with or border the second ending cells 212.

Figure 13B:
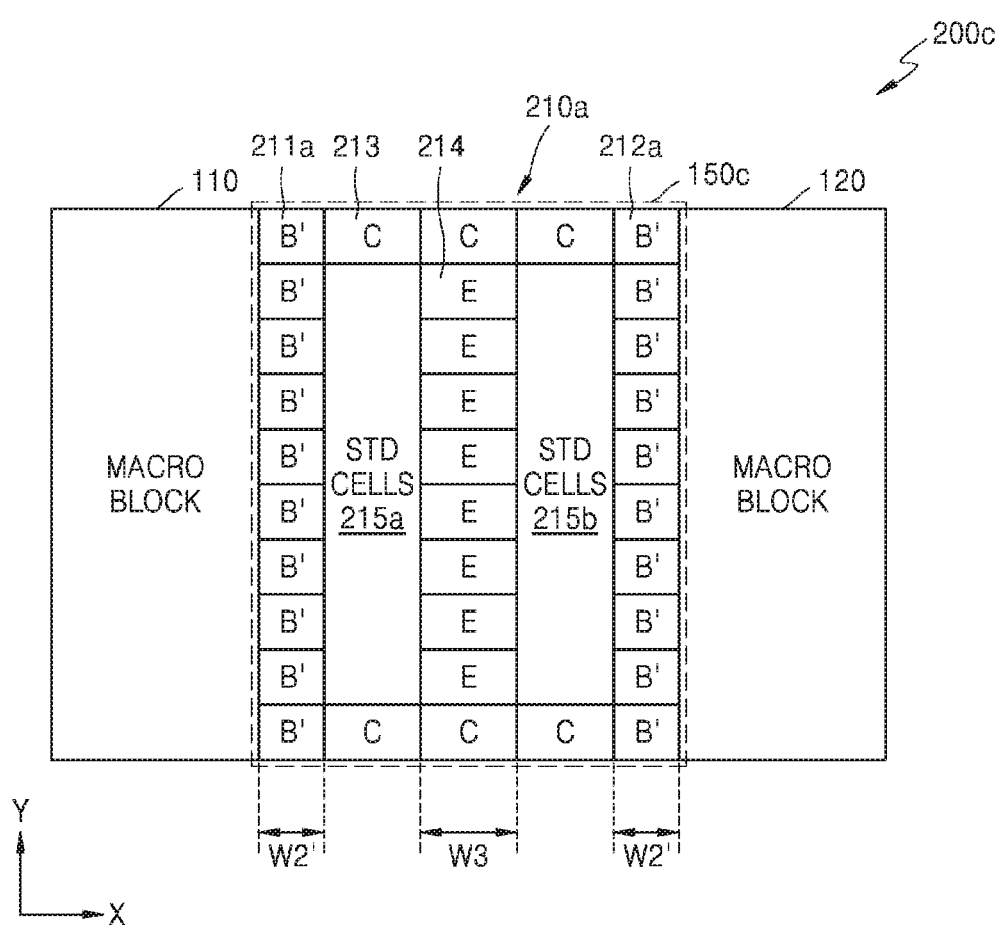

FIG. 13B illustrates an example 200c of an integrated circuit according to an example embodiment of the inventive concepts.

Referring to FIG. 13B, the integrated circuit 200c may be an example of the integrated circuit 200a of FIG. 12. A first macroblock 110 may be in contact with or border first ending cells 211a in the first direction. For example, the first space SP1 between the first macroblock 110 and the first ending cells 211a may be removed (e.g., may be zero), as compared to FIG. 12. Further, a second macroblock 120 may be in contact with or border second ending cells 212a in the first direction. For example, the second space SP2 between the second macroblock 120 and the second ending cells 212a may be removed (e.g., may be zero), as compared to FIG. 12. Thus, a distance between the first and second macroblocks 110 and 120 may be reduced compared to that of FIG. 12, and the total size of the integrated circuit 200c may also be reduced.

However, the inventive concepts are not limited thereto. In an example embodiment, the first macroblock 110 may be in contact with or border the first ending cells 211a, and the second macroblock 120 and each of the second ending cells 212a may be spaced apart from each other by a second space (e.g., the second space SP2 in FIG. 12). In an example embodiment, the first macroblock 110 and each of the first ending cells 211a may be spaced apart from each other by a first space (e.g., the first space SP1 in FIG. 12) and the second macroblock 120 may be in contact with or border the second ending cells 212a.

Figure 14:
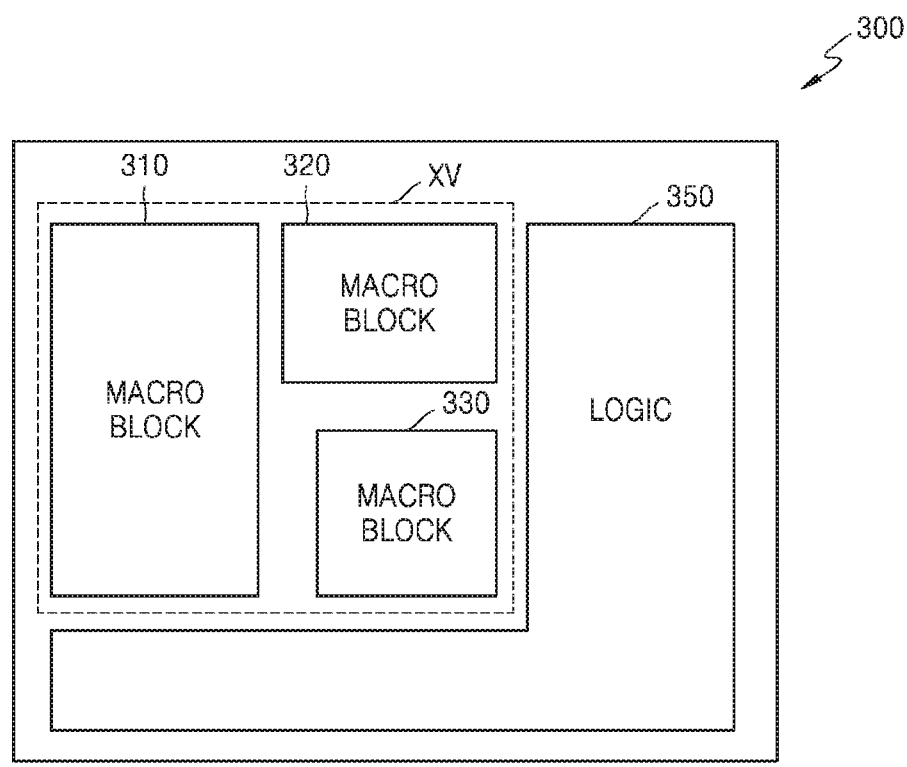
FIG. 14 is a block diagram of an integrated circuit according to an example embodiment of the inventive concepts.

FIG. 14 is a block diagram of an integrated circuit 300 according to an example embodiment of the inventive concepts.

Referring to FIG. 14, the integrated circuit 300 may include first, second, and third macroblocks 310, 320, and 330 and a logic area 350. The first to third macroblocks 310, 320, and 330 may be various hard macro IPs. A plurality of standard cells may be arranged in the logic area 350, and the logic area 350 may be implemented using a standard cell library. Further, a plurality of cells may be arranged in an area between the first macroblock 310 and the second and third macroblocks 320 and 330, and the plurality of cells may include standard cells and ending cells. The description given above with reference to FIG. 1 may also be applied to the present example embodiment.

Figure 15:
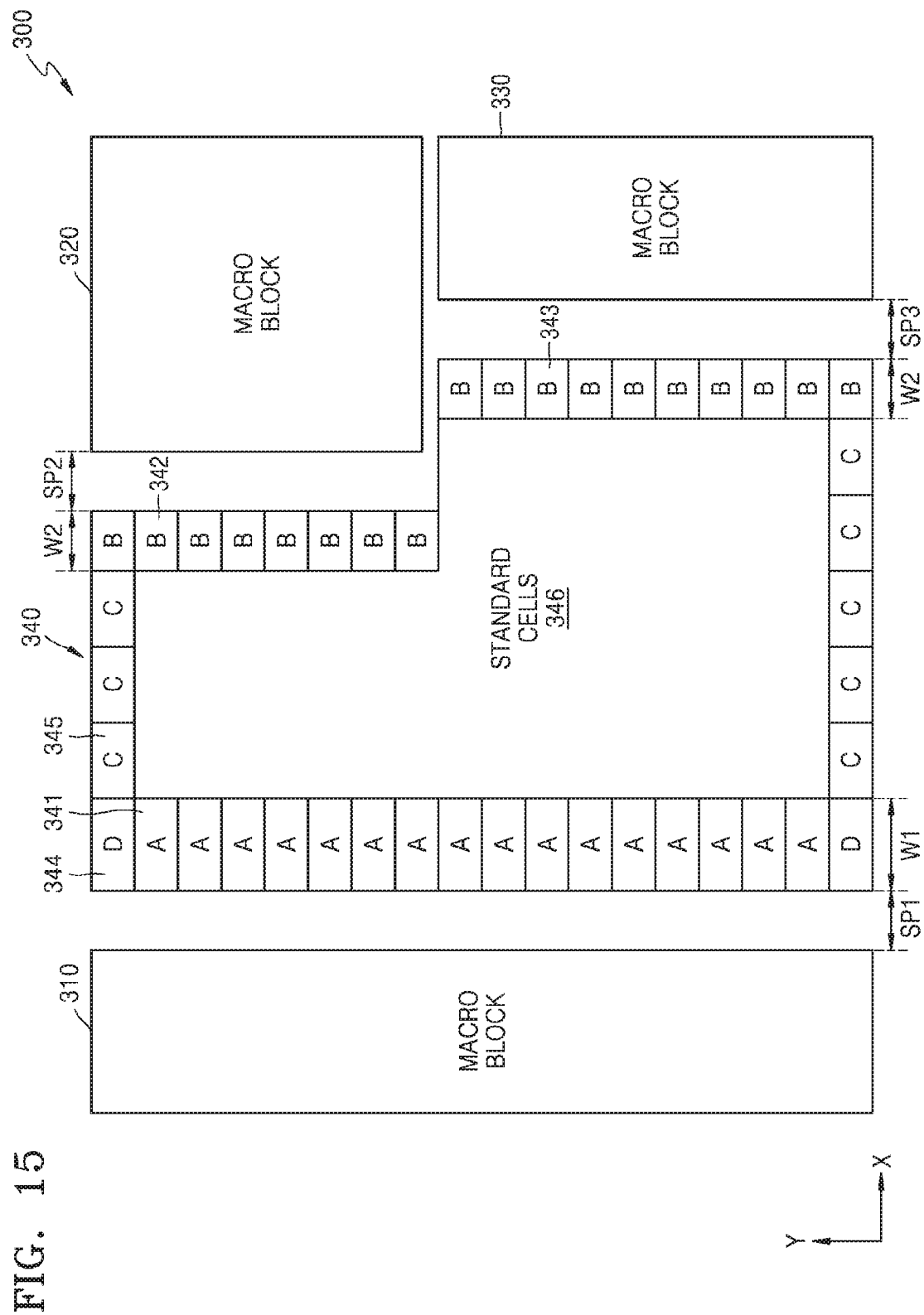
FIG. 15 is an enlarged view of a dashed line region XV in FIG. 14.

FIG. 15 is an enlarged view of a dashed line region XV in FIG. 14.

Referring to FIG. 15, the first and second macroblocks 310 and 320 may be arranged in a first direction (e.g., the X direction), the first and third macroblocks 310 and 330 may be arranged in the first direction, and the second and third macroblocks 320 and 330 may be arranged adjacent to each other in a second direction (e.g., the Y direction). In this case, the height of the first macroblock 310 in the second direction may be greater than each of the heights of the second and third macroblocks 320 and 330 in the second direction. For example, the height of the first macroblock 310 may be similar or comparable to the sum of the height of the second macroblock 320 and the height of the third macroblock 330. The width of the second macroblock 320 in the first direction may be greater than the width of the third macroblock 330 in the first direction.

The integrated circuit 300 may further include a plurality of cells 340 arranged between the first macroblock 310 and the second and third macroblocks 320 and 330. The plurality of cells 340 may include first to fifth ending cells 341 to 345 and standard cells 346. The first ending cells 341 may be adjacent to the first macroblock 310 and may be arranged in a line in the second direction. Each of the first ending cells 341 may have a first width W1 in the first direction. In an example embodiment, the first ending cells 341 may be implemented in the same manner as the first ending cell 131' of FIG. 3A, the first ending cell 131" of FIG. 3B, the first ending cell 131a' of FIG. 7A, or the first ending cell 131a" of FIG. 7B.

The second ending cells 342 may be adjacent to the second macroblock 320 and may be arranged in a line in the second direction. Each of the second ending cells 342 may have a second width W2 in the first direction. The third ending cells 343 may be adjacent to the third macroblock 330 and may be arranged in a line in the second direction. Each of the third ending cells 343 may have a second width W2 in the first direction. In an example embodiment, the second and third ending cells 342 and 343 may be implemented in the same manner as the second ending cell 132' of FIG. 5A, the second ending cell 132" of FIG. 5B, the second ending cell 132a' of FIG. 8A, or the second ending cell 132a" of FIG. 8B. The fourth ending cells 344 may be implemented in the same manner as the third ending cells 133 of FIG. 2, and the fifth ending cells 345 may be implemented in the same manner as the fourth ending cells 134 of FIG. 2.

The first macroblock 310 and each of the first ending cells 341 may be spaced apart from each other by a first space SP1 in the first direction, the second macroblock 320 and each of the second ending cells 342 may be spaced apart from each other by a second space SP2 in the first direction, and the third macroblock 330 and each of the third ending cells 343 may be spaced apart from each other by a third space SP3 in the first direction. In an example embodiment, the first to third spaces SP1 to SP3 may be equal to each other. In an example embodiment, the second and third spaces SP2 and SP3 may be equal to each other and the first space SP1 may be different from the second and third spaces SP2 and SP3. In an example embodiment, the first to third spaces SP1 to SP3 may be different from each other.

In some example embodiments, the first macroblock 310 may be in contact with or border the first ending cells 341 in the first direction. For example, the first space SP1 between the first macroblock 310 and the first ending cells 341 may be removed (e.g., may be zero) as compared to FIG. 15. The second macroblock 320 may be in contact with or border the second ending cells 342 in the first direction. For example, the second space SP2 between the second macroblock 320 and the second ending cells 342 may be removed (e.g., may be zero) as compared to FIG. 15. Further, the third macroblock 330 may be in contact with or border the third ending cells 343 in the first direction. For example, the third space SP3 between the third macroblock 330 and the third ending cells 343 may be removed (e.g., may be zero) as compared to FIG. 15. Thus, a distance between the first macroblock 310 and the second and third macroblocks 320 and 330 may be further reduced compared to that of FIG. 15, and the total size of the integrated circuit 300 may also be reduced.

However, the inventive concepts are not limited thereto. In an example embodiment, the first macroblock 310 may be in contact with or border the first ending cells 341, the second macroblock 320 and each of the second ending cells 342 may be spaced apart from each other by the second space SP2, and the third macroblock 330 and each of the third ending cell 343 may be spaced apart from each other by the third space SP3. In an example embodiment, the first macroblock 310 and each of the first ending cells 341 may be spaced apart from each other by the first space SP1, the second macroblock 320 may be in contact with or border the second ending cells 342, and the third macroblock 330 may be in contact with or border the third ending cells 343.

Figure 16:
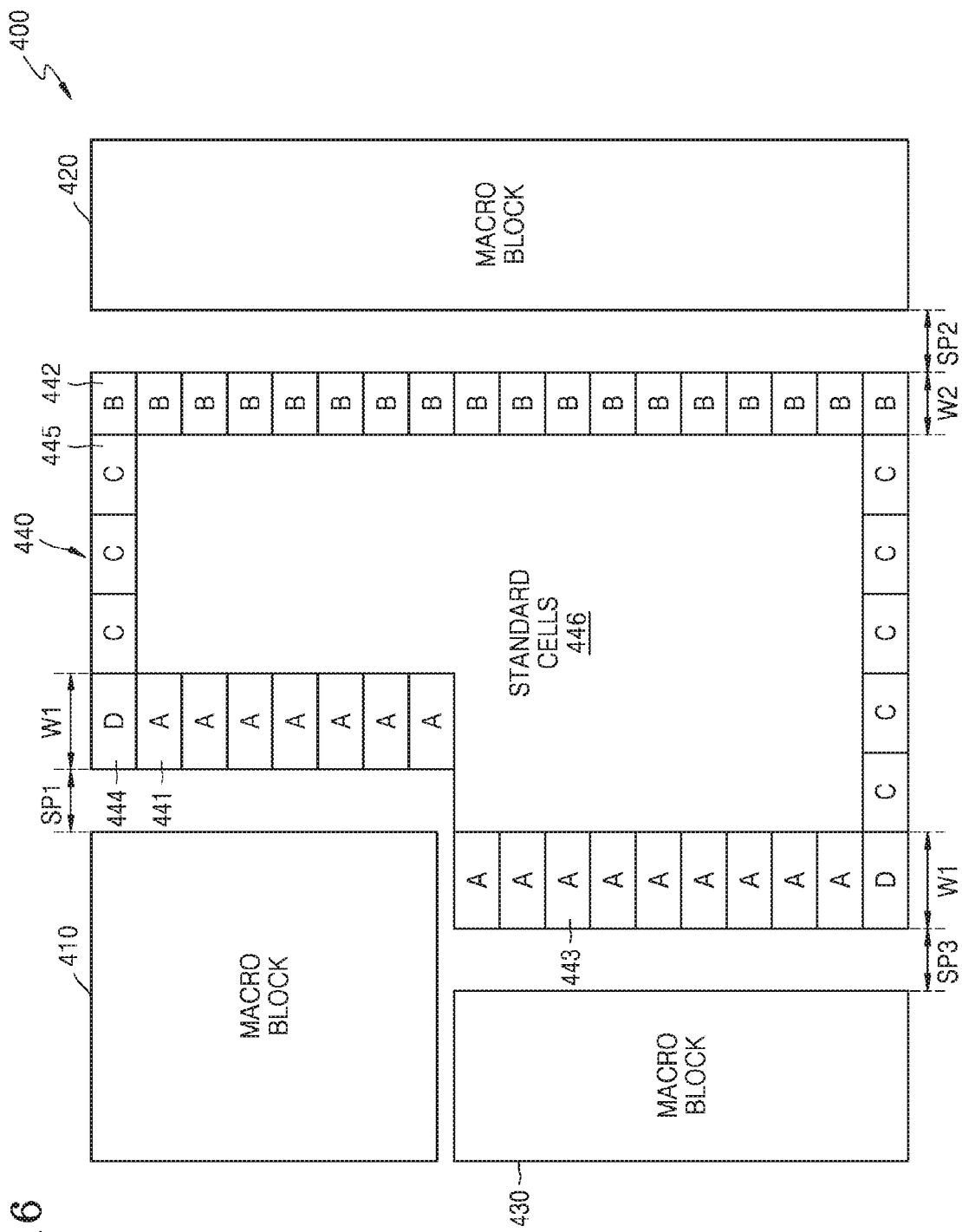
FIG. 16 illustrates an example of an integrated circuit according to an example embodiment of the inventive concepts.

FIG. 16 illustrates an example 400 of an integrated circuit according to an example embodiment of the inventive concepts.

Referring to FIG. 16, the integrated circuit 400 may include first to third macroblocks 410 to 430 and a plurality of cells 440. The first and second macroblocks 410 and 420 may be arranged in a first direction (e.g., the X direction), the second and third macroblocks 420 and 430 may be arranged in the first direction, and the first and third macroblocks 410 and 430 may be arranged adjacent to each other in a second direction (e.g., the Y direction). In this case, the height of the second macroblock 420 in the second direction may be greater than each of the heights of the first and third macroblocks 410 and 430 in the second direction. For example, the height of the second macroblocks 420 may be similar or comparable to the sum of the height of the first macroblocks 410 and the height of the third macroblocks 430. The width of the first macroblock 410 in the first direction may be greater than the width of the third macroblock 430 in the first direction.

The plurality of cells 440 may include first to fifth ending cells 441 to 445 and standard cells 446. The first ending cells 441 may be adjacent to the first macroblock 410 and may be arranged in a line in the second direction. Each of the first ending cells 441 may have a first width W1 in the first direction. The third ending cells 443 may be adjacent to the third macroblock 430 and may be arranged in a line in the second direction. Each of the third ending cells 443 may have the first width W1 in the first direction. In an example embodiment, the first and third ending cells 441 and 443 may be implemented in the same manner as the first ending cell 131' of FIG. 3A, the first ending cell 131" of FIG. 3B, the first ending cell 131a' of FIG. 7A, or the first ending cell 131a" of FIG. 7B.

The second ending cells 442 may be adjacent to the second macroblock 420 and may be arranged in a line in the second direction. Each of the second ending cells 442 may have a second width W2 in the first direction. In an example embodiment, the second ending cells 442 may be implemented in the same manner as the second ending cell 132' of FIG. 5A, the second ending cell 132" of FIG. 5B, the second ending cell 132a' of FIG. 8A, or the second ending cell 132a" of FIG. 8B. The fourth ending cells 444 may be implemented in the same manner as the third ending cells 133 of FIG. 2, and the fifth ending cells 445 may be implemented in the same manner as the fourth ending cells 134 of FIG. 2.

The first macroblock 410 and each of the first ending cells 441 may be spaced apart from each other by a first space SP1 in the first direction, the second macroblock 420 and each of the second ending cells 442 may be spaced apart from each other by a second space SP2 in the first direction, and the third macroblock 430 and each of the third ending cells 443 may be spaced apart from each other by a third space SP3 in the first direction. In an example embodiment, the first to third spaces SP1 to SP3 may be equal to each other. In an example embodiment, the second and third spaces SP2 and SP3 may be equal to each other, and the first space SP1 may be different from the second and third spaces SP2 and SP3. In an example embodiment, the first to third spaces SP1 to SP3 may be different from each other.

In some example embodiments, the first macroblock 410 may be in contact with or border the first ending cells 441 in the first direction. For example, the first space SP1 between the first macroblock 410 and the first ending cells 441 may be removed (e.g., may be zero) as compared to FIG. 16. The second macroblock 420 may be in contact with or border the second ending cells 442 in the first direction. For example, the second space SP2 between the second macroblock 420 and the second ending cells 442 may be removed (e.g., may be zero) as compared to FIG. 16. Further, the third macroblock 430 may be in contact with or border the third ending cells 443 in the first direction. For example, the third space SP3 between the third macroblock 430 and the third ending cells 443 may be removed (e.g., may be zero) compared to FIG. 16. Thus, a distance between the first and third macroblocks 410 and 430 and the second macroblock 420 may be further reduced compared to FIG. 16, and the total size of the integrated circuit 400 may also be reduced.

However, the inventive concepts are not limited thereto. In an example embodiment, the first macroblock 410 may be in contact with or border the first ending cells 441, the third macroblock 430 may be in contact with or border the third ending cells 443, and the second macroblock 420 may be spaced apart from the second ending cells 442 by the second space SP2. In an example embodiment, the first macroblock 410 may be spaced apart from the first ending cells 441 by the first space SP1, the third macroblock 430 may be spaced apart from the third ending cells 443 by the third space SP3, and the second macroblock 420 may be in contact with or border the second ending cells 442.

A method of asymmetrically arranging ending cells in a plurality of cells arranged in an area between macroblocks arranged in the first direction has been described above with reference to FIGS. 1 to 16. However, the inventive concepts are not limited thereto, and ending cells in a plurality of cells arranged in an area between macroblocks arranged in the second direction perpendicular to the first direction may be asymmetrically arranged. In this case, the descriptions given above with reference to FIGS. 1 to 16 may be applied.

Furthermore, the method of arranging asymmetric ending cells, described above with reference to FIGS. 1 to 16, may not be limited to an area between macroblocks. The method of arranging asymmetric ending cells may be applied to a logic area (e.g., the logic area 140 in FIG. 1 or 350 in FIG. 14) in an integrated circuit. For example, ending cells arranged around a plurality of standard cells in a logic area may be asymmetrically arranged according to the example embodiments described above with reference to FIGS. 1 to 16. Thus, the size of the logic area may be reduced, and as a result, the implementation area of the integrated circuit may be reduced.

Figure 17:
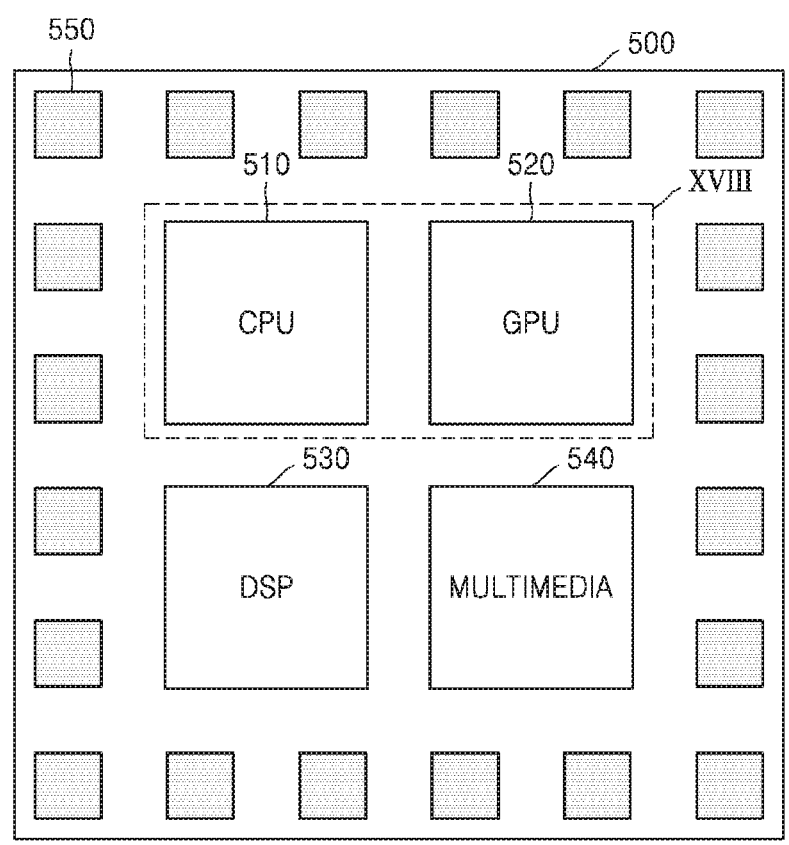
FIG. 17 is a block diagram of an application processor according to an example embodiment of the inventive concepts.

FIG. 17 is a block diagram of an application processor 500 according to an example embodiment of the inventive concepts.

Referring to FIG. 17, the application processor 500 may include a central processing unit (CPU) 510, a graphics processing unit (GPU) 520, a digital signal processor (DSP) 530, a multimedia unit 540, and a plurality of input/output (I/O) blocks 550. Further, the application processor 500 may further include a peripheral circuit including various interfaces for interfacing with the outside. The application processor 500 may be implemented in various forms, and for example, the application processor 500 may be implemented as a system-on-chip.

Figure 18:
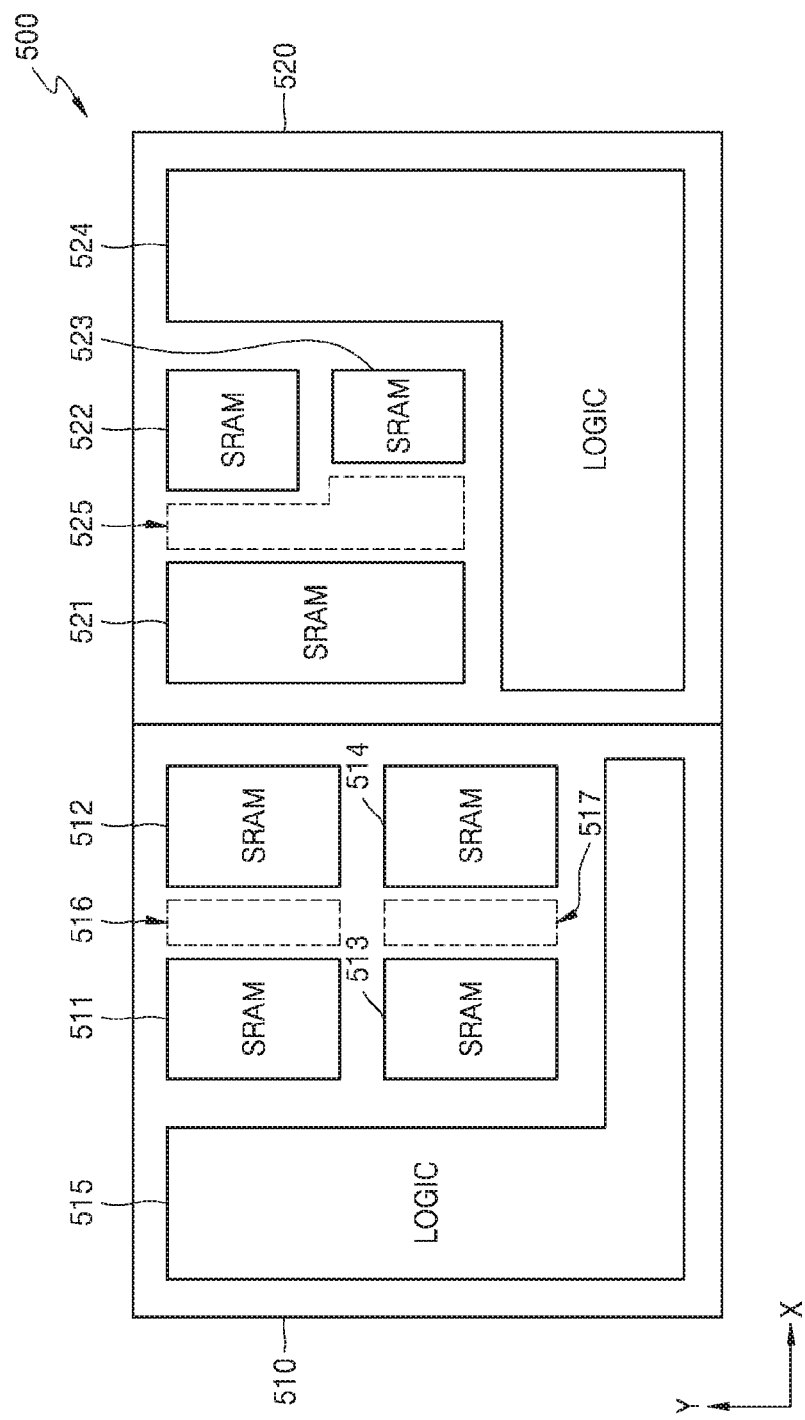
FIG. 18 is an enlarged view of a dashed line region XVIII in FIG. 17.

FIG. 18 is an enlarged view of a dashed line region XVIII in FIG. 17.

Referring to FIG. 18, the CPU 510 may include first to fourth SRAMs 511 to 514 and a logic area 515. The CPU 510 may further include a plurality of cells arranged in a first area 516 between the first and second SRAMs 511 and 512 and a plurality of cells arranged in a second area 517 between the third and fourth SRAMs 513 and 514. The plurality of cells arranged in the first area 516 and the plurality of cells arranged in the second area 517 may be implemented according to one of the example embodiments described above with reference to FIGS. 1 to 13B.

The GPU 520 may include first to third SRAMs 521 to 523 and a logic area 524. The GPU 520 may further include a plurality of cells arranged in an area 525 between the first SRAM 521 and the second and third SRAMs 522 and 523. The plurality of cells arranged in the area 525 may be implemented according to one of the example embodiments described above with reference to FIGS. 14 to 16.

Figure 19:
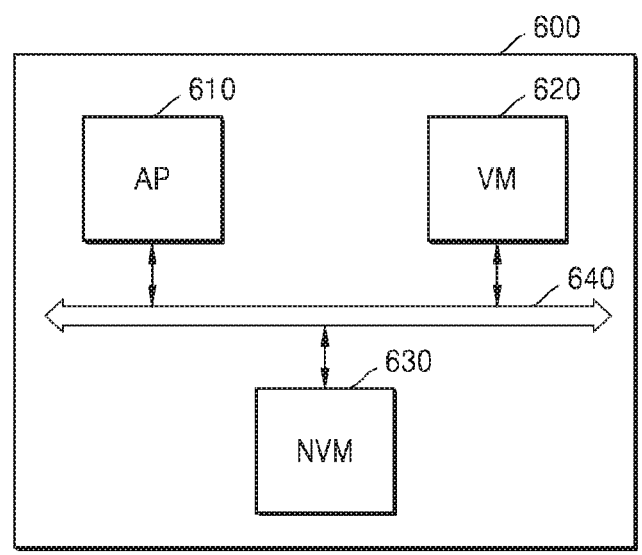
FIG. 19 is a block diagram of a system-on-chip according to an example embodiment of the inventive concepts.

FIG. 19 is a block diagram of a system-on-chip 600 according to an example embodiment of the inventive concepts.

Referring to FIG. 19, the system-on-chip 600 may include an application processor (AP) 610 and a memory electrically connected to the AP 610, for example, a volatile memory (VM) 620 and a non-volatile memory (NVM) 630. For example, the VM 620 may include DRAM. For example, the NVM 630 may include a flash memory or a NAND flash memory. The AP 610, the VM 620, and the NVM 630 may communicate with one other via a system bus 640.

In an example embodiment, the AP 610, the VM 620, and the NVM 630 may be vertically stacked and may be implemented in a system-in-package (SIP). For example, the AP 610 may be arranged on a heat sink, the VM 620 may be arranged on the AP 610, and the NVM 630 may be arranged on the VM 620. However, the inventive concepts are not limited thereto, and the system-on-chip 600 may be implemented in various ways.

The AP 610 may be implemented as shown in FIG. 17. In an example embodiment, the AP 610 may include first and second macroblocks arranged in a first direction and a plurality of cells arranged between the first and second macroblocks. The plurality of cells may include first ending cells adjacent to the first macroblock and arranged in a line in a second direction and second ending cells arranged in a line in the second direction and being implemented asymmetrically to the first ending cells.

In an example embodiment, each of the first ending cells may include a tap or tie configured to receive a power supply voltage or a ground voltage on a first active region, and each of the second ending cells may not include a tap configured to receive a power supply voltage or a ground voltage on a second active region. In this case, the second ending cells may be adjacent to the second macroblock. The plurality of cells may further include a plurality of standard cells arranged between the first ending cells and the second ending cells.

In an example embodiment, the plurality of cells may further include third ending cells adjacent to the second macroblock and arranged in a line in the second direction. In this case, the second ending cells may correspond to center cells arranged in an area between the first ending cells and the third ending cells. Each of the second ending cells may include a tap or tie configured to receive a power supply voltage or a ground voltage on an active region, and each of the first and third second ending cells may not include a tap or tie configured to receive a power supply voltage or a ground voltage on the active region. In this case, the plurality of cells may further include a plurality of standard cells arranged between the first ending cells and the second ending cells and a plurality of standard cells arranged between the second ending cells and the third ending cells.

While the inventive concepts have been particularly shown and described with reference to some example embodiments thereof, it will be understood that various changes in form and details may be made therein without departing from the spirit and scope of the following claims.

What is claimed is:

1. An integrated circuit comprising:
   first and second macroblocks arranged in a first direction; and
   a plurality of cells between the first macroblock and the second macroblock, the plurality of cells including,
      a plurality of first ending cells adjacent to the first macroblock, the first ending cells being in a line in a second direction, each of the first ending cells having a first width in the first direction, the second direction being perpendicular to the first direction,
      a plurality of second ending cells adjacent to the second macroblock, the second ending cells being in a line in the second direction, each of the second ending cells having a second width in the first direction, the second width being different from the first width, and
      a plurality of standard cells between the first ending cells and the second ending cells.

2. The integrated circuit of claim 1, wherein only one of the first ending cells and the second ending cells comprises a tap configured to receive a power supply voltage or a ground voltage and provide the power supply voltage or the ground voltage to an active region.

3. The integrated circuit of claim 1, wherein each of the first ending cells comprises:
   a first active region;
   a tap on the first active region; and
   a first contact on the tap, the first contact extending in the second direction perpendicular to the first direction and electrically connected to a first power rail to which a power supply voltage is applied or a second power rail to which a ground voltage is applied.

4. The integrated circuit of claim 3, wherein each of the first ending cells further comprises:
   a second active region; and
   a dummy contact on the second active region.

5. The integrated circuit of claim 3, wherein each of the first ending cells further comprises:
   first gate lines extending in the second direction and parallel to each other; and
   a first blocking layer between the first macroblock and the first gate lines and extending in the second direction,
   wherein a third width of the first blocking layer in the first direction is greater than a fourth width of each of the first gate lines in the first direction.

6. The integrated circuit of claim 3, wherein each of the first ending cells further comprises:
   a second contact adjacent to the first contact in the first direction, the second contact forming a capacitor with the first contact.

7. The integrated circuit of claim 3, wherein each of the second ending cells comprises:
   a third active region; and
   a dummy contact on the third active region.

8. The integrated circuit of claim 7, wherein each of the second ending cells further comprises:
   second gate lines extending in the second direction and parallel to each other; and
   a second blocking layer between the second macroblock and the second gate lines and extending in the second direction,
   wherein a third width of the second blocking layer in the first direction is greater than a fourth width of each of the second gate lines in the first direction.

9. The integrated circuit of claim 1, wherein the first macroblock and the first ending cells are spaced apart from each other by a first space in the first direction, and the second macroblock and the second ending cells are spaced apart from each other by a second space in the first direction.

10. The integrated circuit of claim 1, wherein the first macroblock borders the first ending cells in the first direction or the second macroblock borders the second ending cells in the first direction.

11. The integrated circuit of claim 1, further comprising:
a third macroblock adjacent to the second macroblock in the second direction perpendicular to the first direction,
wherein the plurality of cells further comprise a plurality of third ending cells, the third ending cells being adjacent to the third macroblock in the first direction, each of the third ending cells having the second width in the first direction.

12. The integrated circuit of claim 1, further comprising:
a third macroblock adjacent to the first macroblock in the second direction perpendicular to the first direction,
wherein the plurality of cells further comprise a plurality of third ending cells, the third ending cells being adjacent to the third macroblock in the first direction, each of the third ending cells having the first width in the first direction.

13. The integrated circuit of claim 1, wherein a first height of the first ending cells in the second direction corresponds to a third height of the first macroblock in the second direction.

14. The integrated circuit of claim 13, wherein a second height of the second ending cells in the second direction corresponds to a fourth height of the second macroblock in the second direction.

15. The integrated circuit of claim 1, wherein the plurality of cells further includes a plurality of third ending cells at an upper area and at a lower area in the second direction between the first macroblock and the second macroblock such that the first, second, and third ending cells surround the standard cells.

16. A system-on-chip comprising:
an application processor including,
first and second macroblocks arranged in a first direction, and
a plurality of cells between the first and second macroblocks, the plurality of cells having,
first ending cells adjacent to the first macroblock and arranged in a line in a second direction perpendicular to, the first direction, each of the first ending cells having a first width in the first direction, the second direction being perpendicular to the first direction, and
second ending cells adjacent to the second macroblock and arranged in a line in the second direction, each of the second ending cells having a second width in the first direction, the second width being different from the first width, each of the second ending cells being asymmetrical to each of the first ending cells; and
a memory electrically connected to the application processor.

* * * * *